(12) United States Patent
Kobayashi et al.

(10) Patent No.: US 11,936,338 B2
(45) Date of Patent: Mar. 19, 2024

(54) METHOD FOR ESTIMATING OPERATION VOLTAGE OF SOLAR BATTERY CELL IN SOLAR BATTERY MODULE AND SOLAR BATTERY CELL OPERATION VOLTAGE ESTIMATION SYSTEM

(71) Applicant: TEIKYO UNIVERSITY, Tokyo (JP)

(72) Inventors: Yasuyuki Kobayashi, Utsunomiya (JP); Shunsuke Kisu, Utsunomiya (JP)

(73) Assignee: TEIKYO UNIVERSITY, Tokyo (JP)

( * ) Notice: Subject to any disclaimer, the term of this patent is extended or adjusted under 35 U.S.C. 154(b) by 291 days.

(21) Appl. No.: 17/312,700

(22) PCT Filed: Dec. 11, 2019

(86) PCT No.: PCT/JP2019/048430
§ 371 (c)(1),
(2) Date: Jun. 10, 2021

(87) PCT Pub. No.: WO2020/122105
PCT Pub. Date: Jun. 18, 2020

(65) Prior Publication Data
US 2022/0038053 A1    Feb. 3, 2022

(30) Foreign Application Priority Data
Dec. 13, 2018    (JP) .................. 2018-233647

(51) Int. Cl.
*H02S 50/15* (2014.01)
*G01R 31/3835* (2019.01)
*G01R 31/396* (2019.01)

(52) U.S. Cl.
CPC .......... *H02S 50/15* (2014.12); *G01R 31/3835* (2019.01); *G01R 31/396* (2019.01)

(58) Field of Classification Search
CPC ....... H02S 50/10; H02S 50/15; G03R 31/396; G03R 31/3835
See application file for complete search history.

(56) References Cited

U.S. PATENT DOCUMENTS

2010/0191383 A1\* 7/2010 Gaul .................... H01L 27/142
700/286
2013/0311121 A1  11/2013 Kohno, et al.
(Continued)

FOREIGN PATENT DOCUMENTS

CN    101603988 A    12/2009
CN    10238847 A     2/2012
(Continued)

OTHER PUBLICATIONS

Extended European Search Report for related Application No. 19896406.6; reported on Aug. 25, 2022.
(Continued)

*Primary Examiner* — Noam Reisner
(74) *Attorney, Agent, or Firm* — von Briesen & Roper, s.c.

(57) ABSTRACT

A method for estimating an operation voltage of a cell includes setting a state in which one cell is shielded from light; detecting a small change of an output current of a module in that state; irradiating another cell with modulated and detecting the small change of the output current light in that state; detecting an operation voltage of the module in that state; generating a first calibration line by connecting a first point and a second point which are plotted on coordinate axes representing a voltage and a relative ratio of a resistor; irradiating a cell the operation voltage of which is to be estimated with the modulated light and detecting the small change of the output current of the module in a state in which none of the cells is shielded from light; detecting the operation voltage of the module in that state; generating a
(Continued)

second calibration line by connecting a third point and the second point which are plotted on the coordinate axes; calculating a value of the relative ratio of the resistor of the cell the operation voltage of which is to be estimated; and calculating a value of a voltage of a fourth point, which becomes the value of the relative ratio of the resistor and is provided on the second calibration line, as the operation voltage of the cell to be estimated.

10 Claims, 11 Drawing Sheets

(56) References Cited

U.S. PATENT DOCUMENTS

| | | | |
|---|---|---|---|
| 2015/0028682 A1 | 1/2015 | Jean et al. | |
| 2015/0330601 A1* | 11/2015 | Jungwirth | G01J 1/08 362/2 |
| 2016/0294189 A1 | 10/2016 | Uno et al. | |
| 2017/0163213 A1 | 6/2017 | Colli et al. | |

FOREIGN PATENT DOCUMENTS

| | | |
|---|---|---|
| CN | 104160619 A | 11/2014 |
| CN | 104769838 A | 7/2015 |
| CN | 105074604 A | 11/2015 |
| CN | 106130475 A | 11/2016 |
| EP | 3573230 A1 | 11/2019 |
| JP | 2013070045 A | 4/2013 |
| JP | 2013131678 A | 7/2013 |
| JP | 2014165277 A | 9/2014 |
| WO | 2018123123 A1 | 7/2018 |
| WO | 2018135123 A1 | 7/2018 |

OTHER PUBLICATIONS

Guanjun Bao, et al: "An ultra-short-term power prediction model based on machine vision for distributed photovoltaic system", 2015. IEEE International Conference on Information and Automation, IEEE, 8 Aug. 8, 2015, pp. 1148-1152.

International Search Report related to Application No. PCT/JP2019/048430; reported on Feb. 10, 2020.

K. Taba et al., Study on heat generation of cell in PV module, Proceedings of JSES/JWEA Joint Conference, 2016, pp. 315-318.

Y. Kobayashi et al., Contactless estimation of a solar cell voltage in a module using modulated light and a phase detector, IEEJ Transactions on Power and Energy, vol. 138, No. 1, pp. 45-52, 2018.

Y. Kobayashi et al., Contactless estimation of a solar cell voltage in a module using modulated light and a phase detector, Electric Engineering in Japan, vol. 204, No. 2, 2018, pp. 3-12.

Chinese Search Report for related Application No. 201980082095.7; dated Jan. 5, 2024.

* cited by examiner

METHOD FOR ESTIMATING OPERATION VOLTAGE OF SOLAR BATTERY CELL IN SOLAR BATTERY MODULE AND SOLAR BATTERY CELL OPERATION VOLTAGE ESTIMATION SYSTEM

CROSS-REFERENCE TO RELATED APPLICATION

This patent application is a 35 USC § 371 U.S. national stage of International Application No. PCT/JP2019/048430 filed on Dec. 11, 2019, which claims the benefit and priority of Japanese Application No. 2018-233647 filed on Dec. 13, 2018, the disclosures of which are incorporated in their entirety by reference herein.

TECHNICAL FIELD

The present invention relates to a method for estimating an operation voltage of a solar battery cell in a solar battery module and a solar battery cell operation voltage estimation system.

Priority is claimed on Japanese Patent Application No. 2018-233647, filed on Dec. 13, 2018, the content of which is incorporated herein by reference.

BACKGROUND ART

Conventionally, abnormality determination systems and methods for solar battery modules that can accurately determine which of a plurality of solar battery cells connected in series is in an abnormal state are known (for example, Patent Document 1).

The abnormality determination system for a solar battery module described in Patent Document 1 determines an abnormality of a solar battery module including a plurality of solar battery cells connected in series. Specifically, the abnormality determination system of the solar battery module includes a modulated light irradiation unit that irradiates one solar battery cell among a plurality of solar battery cells with modulated light, a phase detection unit that outputs a signal according to a state of one solar battery cell based on a signal indicating power generation output of the solar battery module and a reference signal indicating a phase (frequency) of the modulated light, and a determination unit that determines whether or not one solar battery cell is in an abnormal state based on an output signal from the phase detection unit.

CITATION LIST

Patent Literature

Patent Document 1

PCT International Publication No. 2018/135123

Non Patent Literature

Non Patent Document 1

Kohei Takaba, Sanshiro Yamanaka, Yasuhiro Aoyama, Yuki Nishito, Hiroshi Kobayashi, "Study on heat generation in cells of PV module", Proceedings of JSES/JWEA Joint conference (2016), pp. 315-318 (in Japanese)

SUMMARY OF INVENTION

Technical Problem

The abnormality determination system for a solar battery module disclosed in Patent Document 1 can determine whether or not a solar battery cell in the solar battery module is in an abnormal state, but cannot estimate an operation voltage of solar battery cells connected in series in the solar battery module.

In consideration of the above-described problem, an object of the present invention is to provide a method for estimating an operation voltage of a solar battery cell in a solar battery module and a solar battery cell operation voltage estimation system, which can estimate the operation voltage of the solar battery cells connected in series in the solar battery module.

Solution to Problem

According to one aspect of the present invention, there is provided a method for estimating an operation voltage of each of m (m is an integer which is equal to or greater than 2) solar battery cells which constitute a solar battery module and are connected in series, the method including: a first step of setting a state in which a first solar battery cell, which is one solar battery cell among the m solar battery cells, is shielded from light; a second step of irradiating the first solar battery cell with modulated light and detecting a small change of an output current of the solar battery module in the state in which the first solar battery cell is shielded from light; a third step of irradiating each of the (m−1) solar battery cells excluding the first solar battery cell among the m solar battery cells with the modulated light and detecting the small change of the output current of the solar battery module in the state in which the first solar battery cell is shielded from light; a fourth step of detecting an operation voltage of the solar battery module in the state in which the first solar battery cell is shielded from light; a fifth step of generating a first calibration line by connecting a first point and a second point which are plotted on coordinate axes in which a first axis corresponding to one axis is set as a voltage and a second axis corresponding to the other axis is set as a relative ratio of a resistor; a sixth step of setting a state in which none of the m solar battery cells is shielded from light; a seventh step of irradiating a second solar battery cell, which is a solar battery cell the operation voltage of which is to be estimated among the m solar battery cells, with the modulated light and detecting the small change of the output current of the solar battery module in the state in which none of the m solar battery cells is shielded from light; an eighth step of irradiating a third solar battery cell, which is a solar battery cell other than the second solar battery cell among the m solar battery cells, with the modulated light and detecting the small change of the output current of the solar battery module in the state in which none of the m solar battery cells is shielded from light; a ninth step of detecting an operation voltage of the solar battery module in the state in which none of the m solar battery cells is shielded from light; a tenth step of generating a second calibration line by connecting a third point and the second point which are plotted on the coordinate axes; an eleventh step of calculating a value of the relative ratio of the resistor of the second solar battery cell; a twelfth step of calculating a fourth point, which is a point on the second calibration line at which a value of the second axis becomes a value of the relative ratio of the resistor of the second solar battery cell calculated in the tenth step; and a thirteenth step of calculating a value of the first axis of the fourth point as the operation voltage of the second solar battery cell, in which the first point shows a relationship between the value of the operation voltage of the first solar battery cell and the value of the relative ratio of the resistor in the state in which the first solar battery cell is shielded from light, a value of the first axis of the first point is obtained by subtracting a total value of an open circuit voltage of each of the (m−1) solar battery cells from the operation voltage of the solar battery module in the state in which the first solar battery cell is shielded from light, a value of the second axis of the first point is a maximum value of the relative ratio of the resistor, the second point shows a relationship between a value of the operation voltage of any of the (m−1) solar battery cells and the value of the relative ratio of the resistor in the state in which the first solar battery cell is shielded from light, a value of the first axis of the second point is the open circuit voltage of each of the (m−1) solar battery cells, a value of the second axis of the second point is a minimum value of the relative ratio of the resistor, a value of the first axis of the third point is obtained by subtracting a total value of the open circuit voltage of each of the (m−1) solar battery cells from the operation voltage of the solar battery module in the state in which none of the in solar battery cells is shielded from light, and a value of the second axis of the third point is the maximum value of the relative ratio of the resistor.

According to the aspect of the present invention, the relative ratio of the resistor may be obtained by dividing a value of a differential resistance of any of the (m−1) solar battery cells by a sum of a total value of all differential resistances of the m solar battery cells and a value of a load resistor connected in series to the solar battery module.

According to the aspect of the present invention, the small change of the output current of the solar battery module in the state in which the first solar battery cell is shielded from light and the small change of the output current of the solar battery module in the state in which none of the m solar battery cells is shielded from light may be detected by an output voltage of a phase detection unit or a lock-in amplifier, and the eleventh step may include calculating a value of a ratio of the output voltage of the phase detection unit or the lock-in amplifier as the value of the relative ratio of the resistor of the second solar battery cell.

According to the aspect of the present invention, the eleventh step may include calculating a standardized value as the value of the relative ratio of the resistor of the second solar battery cell, and the standardized value may be obtained by dividing a value of a differential resistance of any of the (m−1) solar battery cells by a maximum value of a differential resistance of the first solar battery cell in the light-shielded state.

According to the aspect of the present invention, the eleventh step may include calculating a standardized value as the value of the relative ratio of the resistor of the second solar battery cell, and the standardized value may be obtained by dividing a value of a differential resistance of any of the (m−1) solar battery cells by a sum of a maximum value of a differential resistance of the first solar battery cell in the light-shielded state and the value of the differential resistance of any of the (m−1) solar battery cells.

According to the aspect of the present invention, the state in which the first solar battery cell is shielded from light may be obtained by attaching a mask to the first solar battery cell. In order to irradiate the first solar battery cell in the light-shielded state with the modulated light, light may be shielded except for a part of a light receiving surface of the cell or the modulated light irradiation unit.

According to the aspect of the present invention, the state in which the first solar battery cell is shielded from light may be obtained by attaching a net to the first solar battery cell. In order to irradiate the first solar battery cell in the light-shielded state with the modulated light, light may be shielded using the net so that the light receiving surface of the cell has openings.

According to the aspect of the present invention, the state in which the first solar battery cell is shielded from light may be obtained by disposing a light-shielding object. In order to irradiate the first solar battery cell in the light-shielded state with the modulated light, light may be shielded except for a part of the light receiving surface of the cell or the modulated light irradiation unit.

According to the aspect of the present invention, an irradiation state of the modulated light may be adjusted so that values of a light generation current in equivalent circuits of the (m−1) solar battery cells are equal to each other.

According to another aspect of the present invention, there is provided a solar battery cell operation voltage estimation system which estimates an operation voltage of each of m (m is an integer which is equal to or greater than 2) solar battery cells which constitute a solar battery module and are connected in series, the system including: a modulated light irradiation unit configured to irradiate any of the m solar battery cells with modulated light; a light-shielded state setting unit configured to set a state in which a first solar battery cell, which is one solar battery cell of the m solar battery cells, is shielded from light; and an output current small change detection unit configured to irradiate the first solar battery cell with the modulated light and to detect a small change of an output current of the solar battery module in the state in which the first solar battery cell is shielded from light, wherein the modulated light irradiation unit irradiates each of the (m−1) solar battery cells excluding the first solar battery cell among the m solar battery cells with the modulated light and the output current small change detection unit detects the small change of the output current of the solar battery module in the state in which the first solar battery cell is shielded from light by the light-shielded state setting unit, the system includes: a solar battery module operation voltage detection unit configured to detect an operation voltage of the solar battery module in the state in which the first solar battery cell is shielded from light; and a calibration line generation unit configured to generate a first calibration line by connecting a first point and a second point which are plotted on coordinate axes in which a first axis corresponding to one axis is set as a voltage, and a second axis corresponding to the other axis is set as a relative ratio of a resistor, the light-shielded state setting unit sets a state in which none of the m solar battery cells is shielded from light, the modulated light irradiation unit irradiates a second solar battery cell, which is a solar battery cell the operation voltage of which is to be estimated among the m solar battery cells, with modulated light, the output current small change detection unit detects the small change of the output current of the solar battery module, the modulated light irradiation unit irradiates a third solar battery cell, which is a solar battery cell other than the second solar battery cell among the m solar battery cells, with the modulated light, the output current small change detection unit detects the small change of the output current of the solar battery module, and the solar battery module operation voltage detection unit detecting an operation voltage of the solar battery module in the state in which none of the m solar battery cells is shielded from light, the calibration line generation unit generates a second calibration line by connecting a third point and the second point which are plotted on the coordinate axes, the system includes: a resistor relative ratio calculation unit configured to calculate a value of the relative ratio of the resistor of the second solar battery cell; and a solar battery cell operation voltage calculation unit configured to calculate the operation voltage of the second solar battery cell, in which the solar battery cell operation voltage calculation unit calculates a fourth point, which is a point on the second calibration line at which a value of the second axis becomes a value of the relative ratio of the resistor of the second solar battery cell calculated by the resistor relative ratio calculation unit, and subsequently calculates a value of the first axis of the fourth point as the operation voltage of the second solar battery cell, the first point shows a relationship between the value of the operation voltage of the first solar battery cell and the value of the relative ratio of the resistor in the state in which the first solar battery cell is shielded from light, a value of the first axis of the first point is obtained by subtracting a total value of an open circuit voltage of each of the (m−1) solar battery cells from the operation voltage of the solar battery module in the state in which the first solar battery cell is shielded from light, a value of the second axis of the first point is a maximum value of the relative ratio of the resistor, the second point shows a relationship between a value of the operation voltage of any of the (m−1) solar battery cells and the value of the relative ratio of the resistor in the state in which the first solar battery cell is shielded from light, a value of the first axis of the second point is the open circuit voltage of each of the (m−1) solar battery cells, a value of the second axis of the second point is a minimum value of the relative ratio of the resistor, a value of the first axis of the third point is obtained by subtracting a total value of the open circuit voltage of each of the (m−1) solar battery cells from the operation voltage of the solar battery module in the state in which none of the m solar battery cells is shielded from light, and a value of the second axis of the third point is the maximum value of the relative ratio of the resistor.

Advantageous Effects of Invention

According to the present invention, it is possible to provide a method for estimating an operation voltage of a solar battery cell in a solar battery module and a solar battery cell operation voltage estimation system, which can estimate the operation voltage of the solar battery cells connected in series in the solar battery module.

DESCRIPTION OF EMBODIMENTS

Before explaining embodiments of a method for estimating an operation voltage of a solar battery cell in a solar battery module and a solar battery cell operation voltage estimation system of the present invention, an operational principle and the like of the solar battery cell operation voltage estimation system of the present invention will be described.

Figure 1:
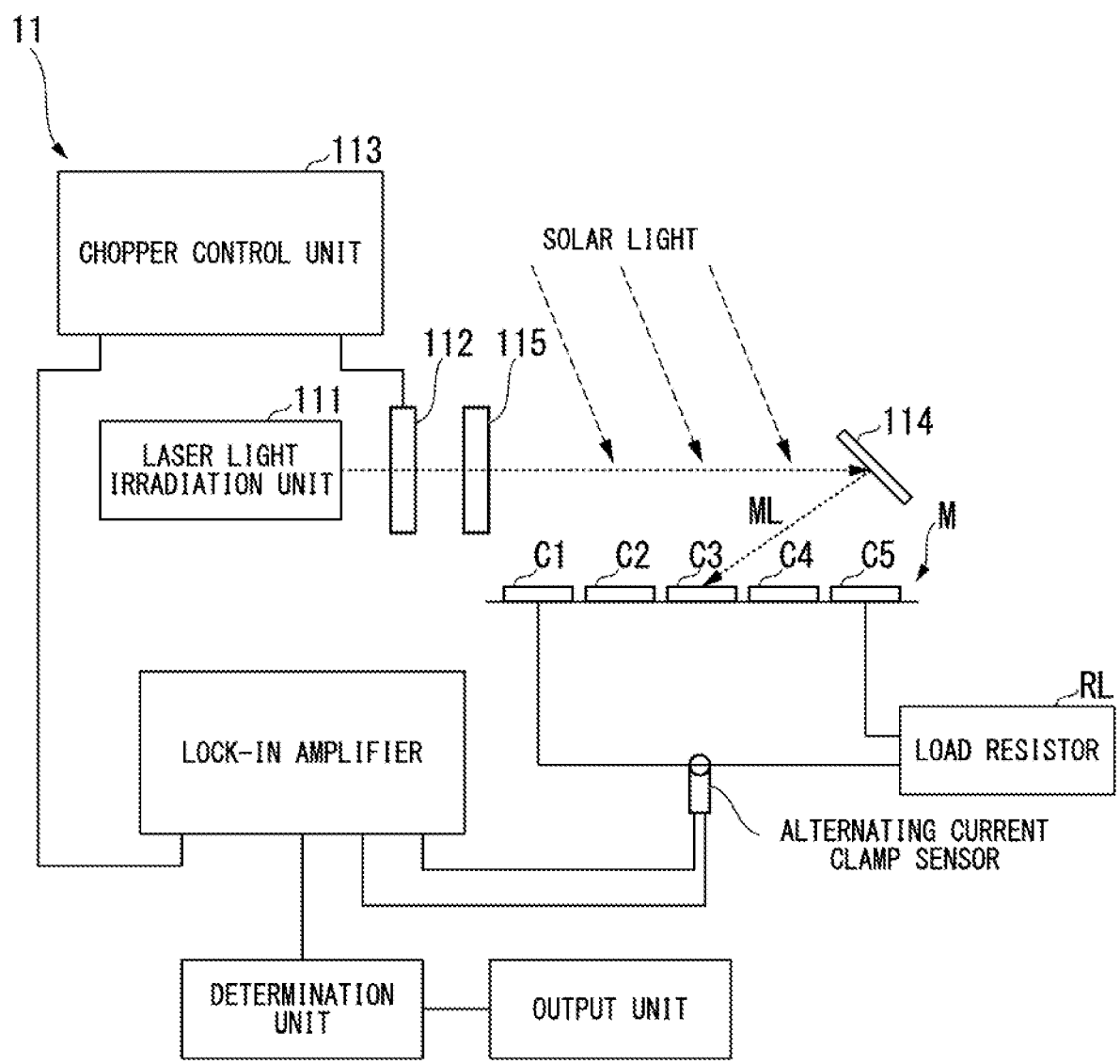
FIG. 1 is a diagram corresponding to FIG. 10 of Patent Document 1.
Figure 10:
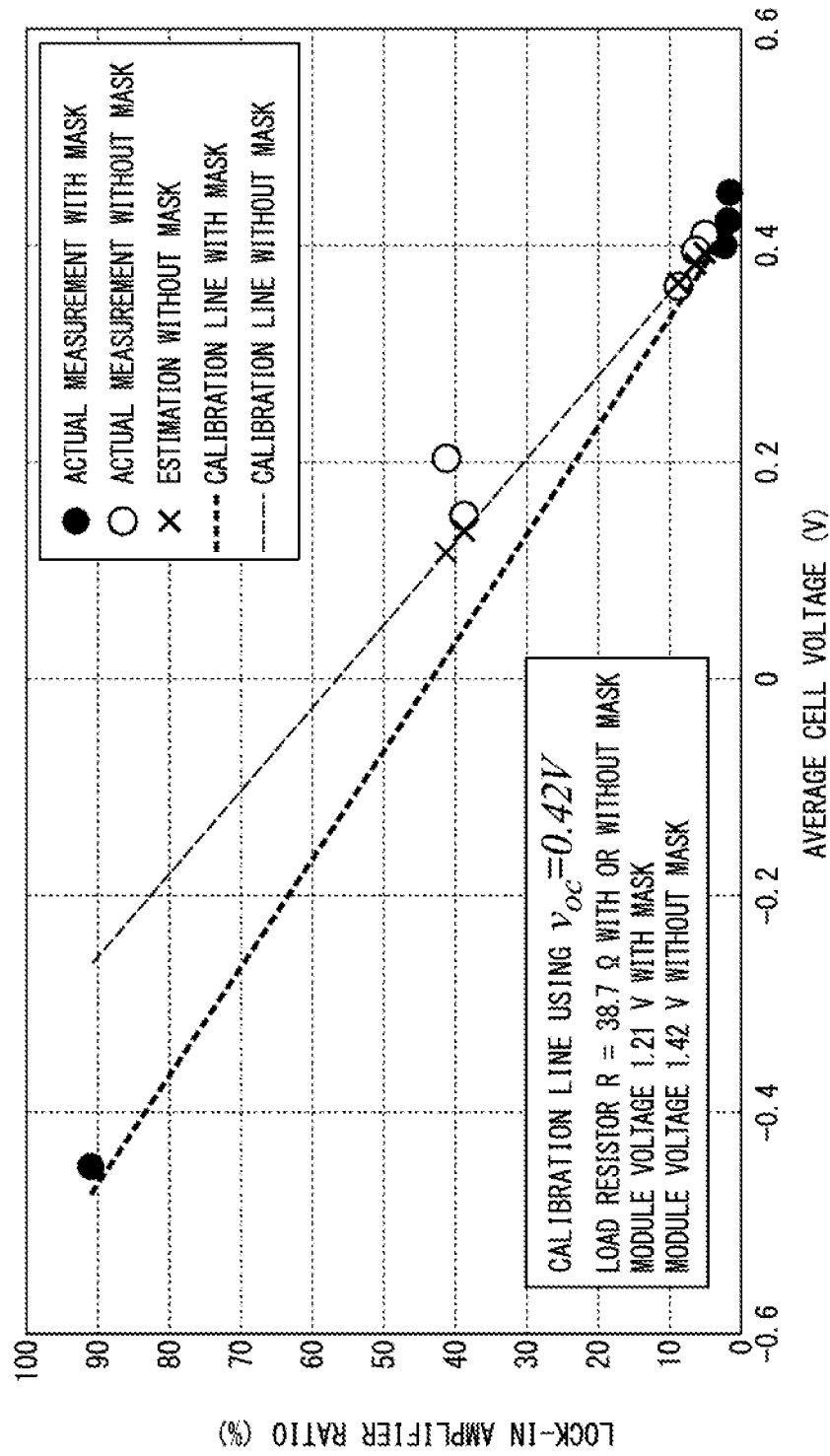
FIG. 10 is a diagram showing measurement data of Example 4.

FIG. 1 is a diagram corresponding to FIG. 10 of Patent Document 1.

In a system shown in FIG. 1, only a certain solar battery cell C3 in a solar battery module M under power generation is irradiated with weak modulated light ML so that an operation voltage of the solar battery cell C3 does not change. A very small amount of a synchronization signal with the modulated light ML is mixed in an output current of the solar battery module M according to the operation voltage of the solar battery cell C3. The very small amount of the synchronization signal mixed in the output current of the solar battery module M is extracted by using an alternating current clamp sensor, which is electrically contactless with a wiring connected to the solar battery module M, and a phase detection unit or a lock-in amplifier (here, the phase detection unit and the lock-in amplifier are referred to simply as a "lock-in amplifier").

Figure 2:
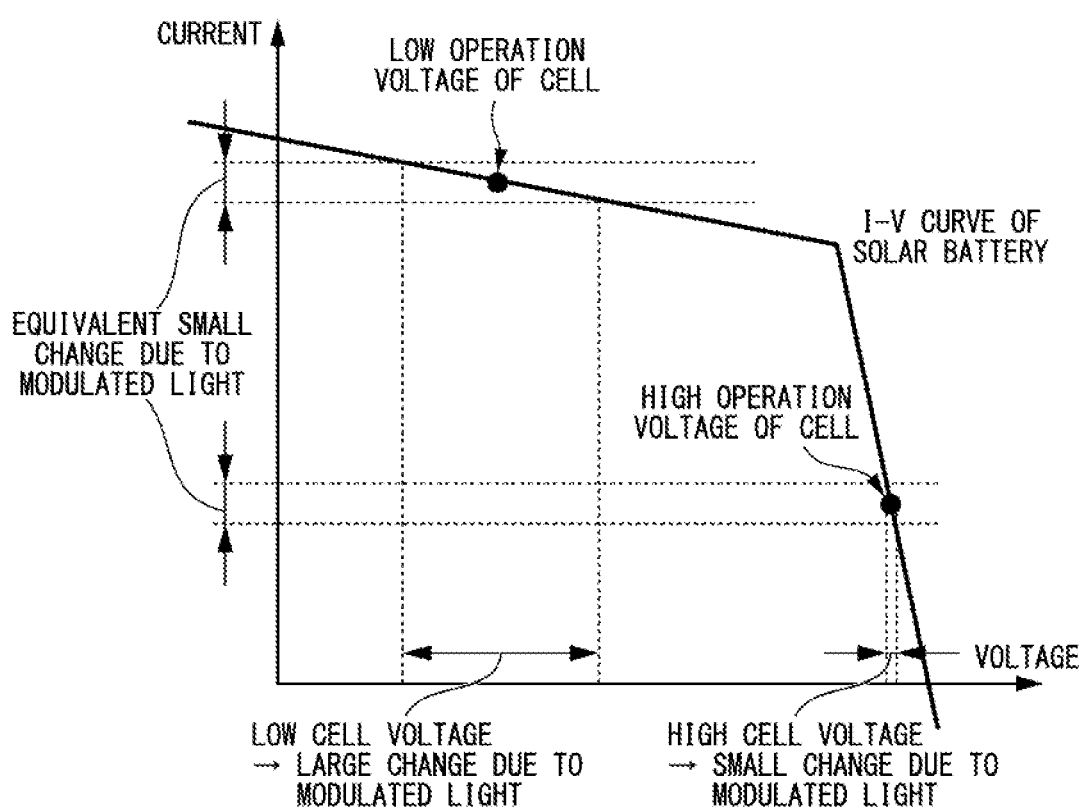
FIG. 2 is a diagram showing an example of an I-V curve for explaining an operational principle of a solar battery cell operation voltage estimation system of the present invention.

FIG. 2 is a diagram showing an example of an I-V curve for explaining the operational principle of the solar battery cell operation voltage estimation system of the present invention. In FIG. 2, a horizontal axis shows the operation voltage of the solar battery cell C3 (see FIG. 1), and a vertical axis shows the output current of the solar battery module M (see FIG. 1).

As shown in FIG. 2, as the operation voltage of the solar battery cell C3 (see FIG. 1) decreases and an absolute value of a negative voltage increases (a left side portion of FIG. 2), a slope of the I-V curve becomes smaller. In a case where a minute light generation current derived from the modulated light has a constant amplitude, a voltage change in the solar battery cell C3, that is, an amplitude of the synchronization signal with the modulated light, increases in proportion to a reciprocal of the slope of the I-V curve. As the voltage change increases, a small change $\Delta I$ of the output current of the solar battery module M also increases. Therefore, the solar battery cell operation voltage estimation system of the present invention can estimate the operation voltage of the solar battery cell C3 based on the amplitude of the synchronization signal extracted by the lock-in amplifier.

The small change $\Delta I$ of the output current of the solar battery module M is represented by the following Equations (1) and (2). Specifically, the small change $\Delta I$ of the output current of the solar battery module M is represented in Equation (2) by using the light generation current derived from the modulated light (the amplitude of the modulated light) $\Delta I_{ph}$, a reciprocal (differential resistance) $R_i$ of the slope of the I-V curve in a cell voltage (operation voltage) $V_i$ of a solar battery cell i (the solar battery cell i is the solar battery cell (in the example shown in FIG. 1, the solar battery cell C3) irradiated with the modulated light), and the resistance value R of the load resistor RL (see FIG. 1) connected in series with the solar battery module M.

$$R_i = \frac{nkT}{qI_0} e^{-\frac{q}{kT}V_i} \quad (1)$$

$$\Delta I = \frac{R_i}{R_i \sum_{j \neq i} R_j + R} \Delta I_{ph} \quad (2)$$

In Equations (1) and (2), n is a diode factor of the solar battery cell i, k is a Boltzmann constant, and T is an absolute temperature. q is an elementary charge, and $I_0$ is a saturation current value of a diode of the solar battery cell i.

The differential resistance $R_i$ of the solar battery cell i changes with a change of the voltage (operation voltage $V_i$) of the solar battery cell i. On the other hand, as shown in Equation (2), the small change $\Delta I$ of the output current of the solar battery module M is proportional to the amplitude $\Delta I_{ph}$ of the modulated light. Therefore, a value of the small change $\Delta I$ of the output current of the solar battery module M is affected by an incident condition of the modulated light.

Through earnest research, the present inventor found that the operation voltage of the solar battery cell C3 irradiated with the modulated light can be estimated quantitatively by using, for example, a measurement signal (small change of the output current of the solar battery module M) $\Delta I$ output from the lock-in amplifier shown in FIG. 1.

For example, the solar battery module M in which m (in is an integer which is equal to or greater than 2) solar battery cells C1, C2, C3, C4, and C5 are connected in series as shown in FIG. 1 is considered. Further, a state in which one solar battery cell C1 among the in solar battery cells C1, C2, C3, C4, and C5 is shielded from light (a light-shielded state) is considered. A value of the operation voltage of the solar battery module M in the light-shielded state is set to $V_S$.

The operation voltage of the solar battery cells C2, C3, C4, and C5 other than the solar battery cell C1, which is shielded from light, among the m solar battery cells C1, C2, C3, C4, and C5 is approximately an open circuit voltage $v_{OC}$ (the maximum value of the operation voltages of the solar battery cells C1, C2, C3, C4, and C5). On the other hand, the operation voltage of the solar battery cell C1, which is shielded from light, is a value $V_s-(m-1)v_{OC}$. The operation voltage of the solar battery module M, which is a total value of the operation voltages of the solar battery cells C1, C2, C3, C4, and C5, is represented by Equation (2A).

$$\Sigma_{i=s}^{m-1} v_{OC} + V_S - (m-1)v_{OC} = V_S \quad (2A)$$

A detailed description of the mechanism is disclosed in Non-Patent Document 1. That is, in the solar battery module M in the light-shielded state, the operation voltage $V_s-(m-1)v_{OC}$ of the solar battery cell C1, which is shielded from light, need not be directly measured and can be estimated from the operation voltage $V_s$ of the solar battery module M in the light-shielded state and the open circuit voltage $v_{OC}$ of each of the solar battery cells C2, C3, C4, and C5.

Further, in a case where Equation (2) is modified, a value $\Delta I/\Delta I_{ph}$ which is a ratio of the small change $\Delta I$ of the output current of the solar battery module M to the light generation current (amplitude of the modulated light) $\Delta I_{ph}$ derived from the modulated light can be represented as a relative ratio r of the resistor, which is acquired by dividing the differential resistance $R_i$ of the solar battery cell i the operation voltage of which is estimated by a sum ($\Sigma R_j + R$) of a total value $\Sigma R_j$ of the differential resistances of all the solar battery cells C1, C2, C3, C4, and C5 of the solar battery module M and the resistance value R of the load resistor RL. That is, even in a case where the operation voltages of the solar battery cells C1, C2, C3, C4, and C5 and the operation voltage of the solar battery module M change, the value $\Delta I/\Delta I_{ph}$ does not change as long as a value of the relative ratio r does not change.

From Equation (1), in the light-shielded state, the differential resistance $R_i$ of the solar battery cell C1 (light-shielded cell s), which is shielded from light, is maximized as represented in the following Equation (2B).

$$R_i = \frac{nkT}{qI_0} e^{-\frac{q}{kT}(V_S-(m-1)v_{OC})} \quad (2B)$$

Further, the differential resistance $R_i$ of the solar battery cells C2, C3, C4, and C5 other than the solar battery cell C1 (light-shielded cell s) is minimized as represented in the following Equation (2C).

$$R_i = \frac{nkT}{qI_0} e^{-\frac{q}{kT}v_{OC}} \quad (2C)$$

Therefore, in the light-shielded state, the value of the solar battery cell C1 (light-shielded cell s), which is shielded from light, becomes $\Delta I/\Delta I_{ph}=r_{max}$, and the value of the solar battery cells C2, C3, C4, and C5 other than the solar battery cell C1 (light-shielded cell s) becomes $\Delta I/\Delta I_{ph}=r_{min}$.

In summary, in the solar battery module M in the light-shielded state, a relationship between the operation voltage v of the solar battery cell C1 (light-shielded cell s), which is shielded from light, and the value $\Delta I/\Delta I_{ph}$ becomes (v, $\Delta I/\Delta I_{ph}$)=($V_s-(m-1)v_{OC}$, $r_{max}$). Further, a relationship between the operation voltage v of the solar battery cells C2, C3, C4, and C5 other than the solar battery cell C1 (light-shielded cell s) and the value $\Delta I/\Delta I_{ph}$ becomes (v, $\Delta I/\Delta I_{ph}$)=($v_{OC}$, $r_{min}$).

The value $V_S$ of the operation voltage of the solar battery module M in the light-shielded state is arbitrary. Therefore, the relationship between the operation voltage v of the solar battery cell C1 (light-shielded cell s), which is shielded from light, and the value $\Delta I/\Delta I_{ph}$ and the relationship between the operation voltage v of the solar battery cells C2, C3, C4, and C5 other than the solar battery cell C1 (light-shielded cell s) and the value $\Delta I/\Delta I_{ph}$ in the light-shielded state of various operation voltages V of the solar battery module M are represented by a line segment, in which two points of the following Equation (3) are used as both ends, in a graph of (v, $\Delta I/\Delta I_{ph}$).

$$\begin{cases} \left(v, \dfrac{\Delta I}{\Delta I_{ph}}\right) = (V-(m-1)v_{oc}, r_{max}) \ \ldots \text{Light-shielded cell } s \\ \left(v, \dfrac{\Delta I}{\Delta I_{ph}}\right) = (v_{oc}, r_{min}) \ \ldots \text{Cell other than light-shielded cell } s \end{cases} \quad (3)$$

In a case where the solar battery module M is not in the light-shielded state, the value $\Delta I/\Delta I_{ph}$ becomes a value in a range of $r_{min}$ to $r_{max}$.

In a case where the operation voltage of the solar battery module M is a value V, it is assumed that a point (v, $\Delta I/\Delta I_{ph}$) which indicates the relationship between the operation voltage v of the solar battery cells (for example, the solar battery cell C1 (light-shielded cell s), which is shielded from light, the solar battery cells C2, C3, C4, and C5 other than the solar battery cell C1 (light-shielded cell s), and the like) in various states in the solar battery module M, and the value $\Delta I/\Delta I_{ph}$, is on the line segment in which the two points of Equation (3) are used as both ends.

Further, in a case where the operation voltage of the solar battery module M is a value V' which is different from the value V, it is assumed that the point (v, $\Delta I/\Delta I_{ph}$) which indicates the relationship between the operation voltage v of the solar battery cells in the various states in the solar battery module M and the value $\Delta I/\Delta I_{ph}$ is on a line segment in which a point (V'−(m−1)$v_{OC}$, $r_{max}$) and a point ($v_{OC}$, $r_{min}$) are used as both ends.

The present inventor has experimentally verified validity of the assumptions through earnest research. In the experiment, the operation voltage of each of the solar battery cells C1, C2, C3, C4, and C5 in the solar battery module M is directly measured by another method while performing the measurement using the system shown in FIG. 1.

Figure 3:
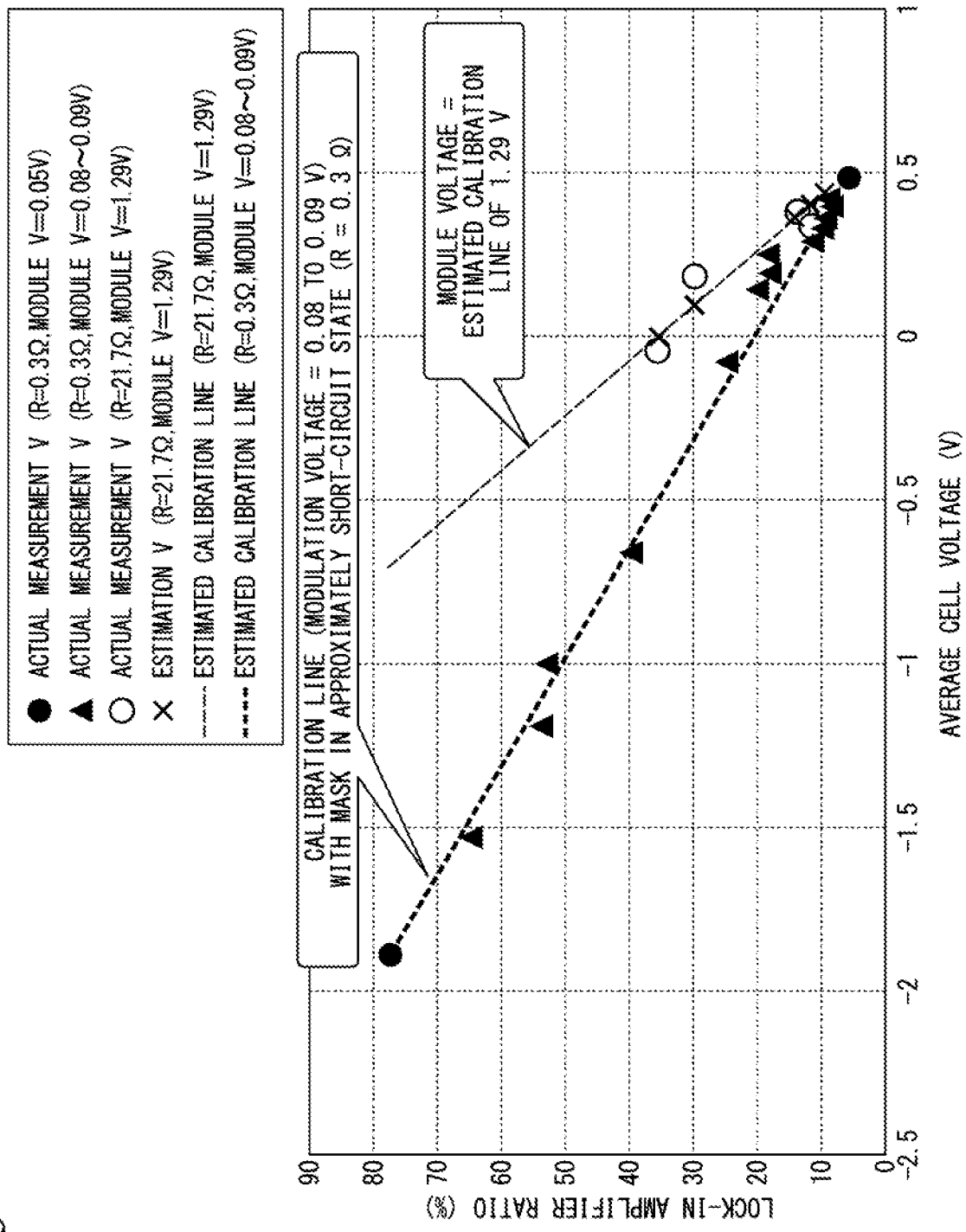
FIG. 3 is a diagram showing measurement data of a verification experiment.

FIG. 3 is a diagram showing measurement data of a verification experiment. A horizontal axis of FIG. 3 shows an average operation voltage [V] of the solar battery cells C1, C2, C3, C4, and C5, and a vertical axis shows a lock-in amplifier ratio (a ratio of the output voltage of the lock-in amplifier) $r_{\Delta I}$.

In the verification experiment, from measurement data indicated by "●", a line segment (a line segment on a left side in FIG. 3) indicating a calibration line with a mask in a case of using a load resistor RL (see FIG. 1), in which the resistance value R is 0.3 [Ω], is estimated. Since the fact that other measurement data indicated by "▲" and "○" is almost on the line segment is confirmed, it is determined that the above-described assumption is generally valid.

In addition, the present inventor has verified the validity of the above-described assumptions through earnest research using a simple equivalent circuit model of the solar battery cell. As a result, in a case where the lock-in amplifier ratio $r_{\Delta I}$ is not close to 1 or 0, it can be confirmed that a curve of the lock-in amplifier ratio $r_{\Delta I}$ can be approximated as the line segment for the operation voltage $v_i$ of the solar battery cell.

In the verification, the solar battery module M in which m (m is an integer which is equal to or greater than 2) solar battery cells C1, C2, C3, C4, and C5 are connected in series (the operation voltage of the solar battery module M is a value $V_m$) is considered. I-V characteristics of one solar battery cell are approximated in the following Equation (7), and I-V characteristics of a composite of the remaining (m−1) solar battery cells are approximated in the following Equation (8).

$$I = I_{ph} - I_0 e^{\frac{q}{nkT}V} \quad (7)$$

$$I = I_{ph} - I'_0 e^{\frac{q}{nkT}V} \quad (8)$$

In the verification, it is assumed that the light generation current (amplitude of the modulated light) $\Delta I_{ph}$ and the diode factor n are equal in each solar battery cell. In Equations (7) and (8), $I_0$ is a saturation current value of the diode of one solar battery cell, and $I'_0$ is the saturation current value of the diode of the composite solar battery cell.

In a case where one solar battery cell is in an open state (I=0), the open circuit voltage $v_{OC}$ of the solar battery cell is represented by the following Equation (9).

$$I_0 = I_{ph} e^{-\frac{q}{nkT} v_{OC}} \quad (9)$$

Since the open circuit voltage of the composite of the remaining (m−1) solar battery cells is approximately a value (m−1)$v_{OC}$, the saturation current value $I'_0$ of the diode of the composite solar battery cell in Equation (8) is represented by the following Equation (10).

$$I'_0 = I_{ph} e^{-\frac{q}{nkT}(m-1)v_{OC}} \quad (10)$$

A differential resistance $R_i$ of one certain solar battery cell (the operation voltage of the solar battery cell is a value $v_i$) is represented by the following Equation (11).

$$R_i = \frac{nkT}{qI_0} e^{-\frac{q}{nkT} v_i} \quad (11)$$

A differential resistance $R_{m-1}$ of the composite of the remaining (m−1) solar battery cells (operation voltage of the composite is a value $V_m - v_i$) is represented by the following Equation (12).

$$R_{m-1} = \frac{nkT}{qI'_0} e^{-\frac{q}{nkT}(V_m - v_i)} \quad (12)$$

Using Equations (9) to (12), a ratio $r_{\Delta I}$ of a differential resistance of the one certain solar battery cell is represented by the following Equation (13) (for simplicity, the resistance value R of the load resistor RL in a denominator is ignored).

$$r_{\Delta I} = \frac{R_i}{R_L + R_{m-1}} = \frac{1}{1 + e^{\frac{q}{nkT}\{(m-2)v_{OC} - V_m + 2v_i\}}} \quad (13)$$

Since the operation voltage $v_i$ of the one certain solar battery cell is in a range of $v_i = V_m - (m-1)v_{OC}$ to $v_{OC}$, a range of a value of the ratio $r_{\Delta I}$ of the differential resistance of the solar battery cell represented in Equation (13) is represented by the following Equation (14).

$$r_{\Delta I} = \frac{1}{1 + e^{\frac{q}{nkT}(V_m - mv_{OC})}} \sim \frac{1}{1 + e^{\frac{q}{nkT}(-V_m - mv_{OC})}} \quad (14)$$

Equation (13) represents a sigmoid curve.

Figure 4:
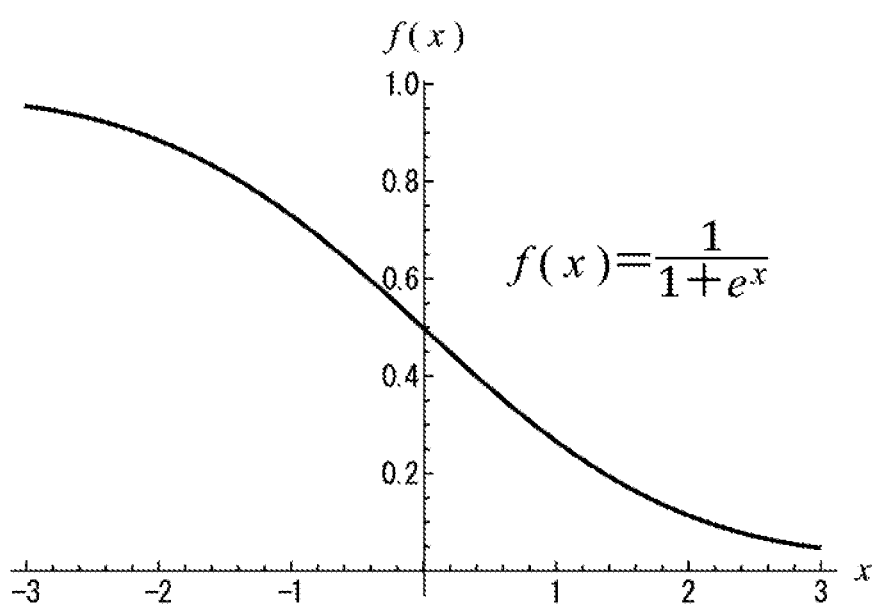
FIG. 4 is a diagram showing an example of a sigmoid curve.

FIG. 4 is a diagram showing an example of the sigmoid curve.

The range of the value of the ratio rot of the differential resistance of the solar battery cell represented by Equation (14) exists symmetrically with respect to an intersection of the sigmoid curve shown in FIG. 4 and the vertical axis of FIG. 4. In a vicinity of a value x=0 on the vertical axis of FIG. 4, the sigmoid curve can be approximated as a line segment.

Therefore, as long as a range in which $|V_m-mv_{OC}|$ is small, that is, a range corresponding to the vertical axis of FIG. 4, in which the value of the ratio $r_{Af}$ of the differential resistance of the solar battery cell is not close to 1 or 0 (specifically, $r_{Af}=0.2$ to 0.8), the curve showing the ratio $r_{Af}$ of the differential resistance of the solar battery cell can be approximated as the line segment for the operation voltage $v_i$ of the solar battery cell.

Hereinafter, embodiments of a method for estimating the operation voltage of the solar battery cell in the solar battery module and the solar battery cell operation voltage estimation system of the present invention will be described.

First Embodiment

Figure 5:
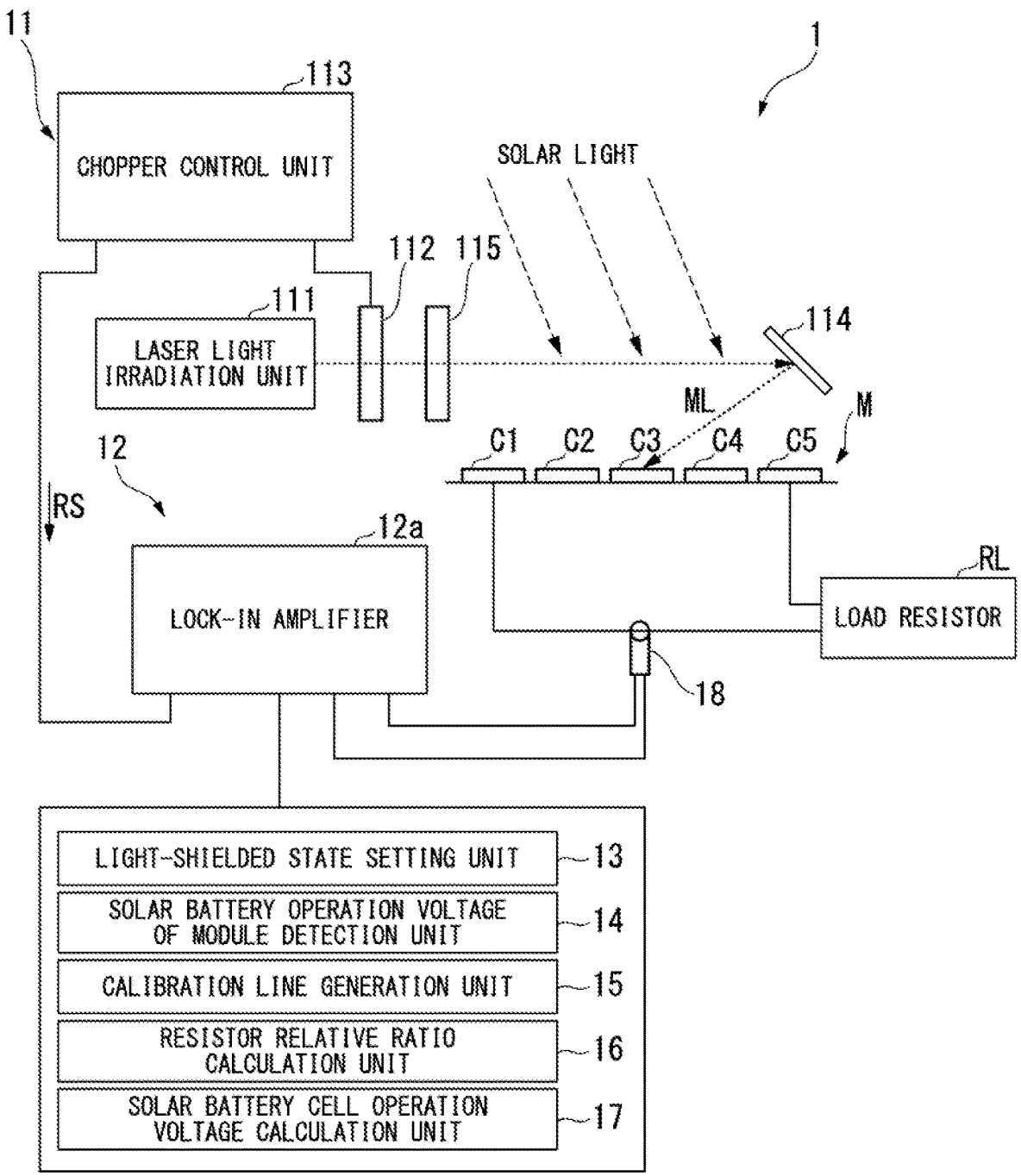
FIG. 5 is a diagram showing an example of a configuration of a solar battery cell operation voltage estimation system according to a first embodiment.

FIG. 5 is a diagram showing an example of a configuration of a solar battery cell operation voltage estimation system 1 of a first embodiment.

In the example shown in FIG. 5, the solar battery cell operation voltage estimation system 1 of the first embodiment is applied to the solar battery module M. The solar battery module M includes the plurality of solar battery cells C1, C2, C3, C4, and C5 connected in series. The solar battery module M is connected to the load resistor RL.

In the example shown in FIG. 5, the solar battery module M includes the five solar battery cells C1, C2, C3, C4, and C5. However, in another example, the solar battery module M may include an arbitrary number other than five (m, m is an integer which is equal to or greater than 2) of solar battery cells connected in series.

In the example shown in FIG. 5, the solar battery cell operation voltage estimation system 1 includes a modulated light irradiation unit 11, an output current small change detection unit 12, a light-shielded state setting unit 13, a solar battery module operation voltage detection unit 14, a calibration line generation unit 15, a resistor relative ratio calculation unit 16, a solar battery cell operation voltage calculation unit 17, and an alternating current clamp sensor 18. The modulated light irradiation unit 11 includes a laser light irradiation unit 111, a light chopper unit 112, a chopper control unit 113, a reflector 114, and a filter 115. The laser light irradiation unit 111 irradiates laser light such as He—Ne laser.

In the example shown in FIG. 5, as described above, the modulated light irradiation unit 11 includes the laser light irradiation unit 111. However, in another example, the modulated light irradiation unit 11 may include an irradiation unit that irradiates light other than the laser light.

In the example shown in FIG. 5, the light chopper unit 112 modulates the laser light irradiated from the laser light irradiation unit 111 into the modulated light ML having a predetermined phase (frequency). The chopper control unit 113 controls the light chopper unit 112. Further, the chopper control unit 113 outputs a reference signal RS indicating the phase (frequency) of the modulated light ML modulated by the light chopper unit 112. The filter 115 dims the modulated light ML modulated by the light chopper unit 112. The filter 115 is, for example, a Neutral Density (ND) filter. The reflector 114 reflects the modulated light ML dimmed by the filter 115. The solar battery cell C3 is irradiated with the modulated light ML reflected by the reflector 114.

In the example shown in FIG. 5, the solar battery cell C3 is irradiated with the modulated light ML reflected by the reflector 114. However, in another example, instead, any of the solar battery cells C1, C2, C4, and C5 other than the solar battery cell C3 may be irradiated with the modulated light ML reflected by the reflector 114.

In the example shown in FIG. 5, between the laser light irradiation unit 111 and the solar battery module M, the light chopper unit 112, the filter 115, and the reflector 114 are arranged in the order of the light chopper unit 112, the filter 115, and the reflector 114. In another example, instead, the order of the arrangement of the light chopper unit 112, the filter 115, and the reflector 114 may be different.

In the example shown in FIG. 5, the output current small change detection unit 12 includes a lock-in amplifier 12a. The lock-in amplifier 12a is connected to the alternating current clamp sensor 18 that is electrically contactless with the wiring connected to the solar battery module M.

The output current small change detection unit 12 detects a small change (change of a magnitude of a weak signal relevant to the operation voltage of the solar battery cells C1, C2, C3, C4, and C5) of the output current of the solar battery module M through the alternating current clamp sensor 18 and the lock-in amplifier 12a. Specifically, the small change of the output current of the solar battery module M is detected by the output voltage of the lock-in amplifier 12a.

The reference signal RS output from the chopper control unit 113 is input to the lock-in amplifier 12a. That is, the reference signal RS input to the lock-in amplifier 12a indicates the phase (frequency) of the modulated light ML irradiated from the modulated light irradiation unit 11 to the solar battery cell C3.

In the example shown in FIG. 5, the light-shielded state setting unit 13 sets the state of the solar battery module M as a state in which one solar battery cell (for example, the solar battery cell C1) of the solar battery cells C1, C2, C3, C4, and C5 is shielded from light.

The solar battery module operation voltage detection unit 14 detects the operation voltage $V_S$ of the solar battery module M, for example, in the state in which the solar battery cell C1 is shielded from light.

The calibration line generation unit 15 generates a calibration line by plotting two points on coordinate axes (see FIG. 6), in which a horizontal axis is set as voltage and a vertical axis is set as the relative ratio of the resistor, and connecting the two points.

The resistor relative ratio calculation unit 16 calculates the relative ratio of the resistor of the solar battery cell (for example, the solar battery cell C3) the operation voltage of which is to be estimated among the solar battery cells C1, C2, C3, C4, and C5.

The solar battery cell operation voltage calculation unit 17 calculates the operation voltage of a solar battery cell Ck (for example, the solar battery cell C3) which is to be estimated.

In the example shown in FIG. 5, in a case where the solar battery cell operation voltage estimation system 1 estimates, for example, the operation voltage of the solar battery cell C3, the light-shielded state setting unit 13 first sets the state of the solar battery module M (specifically, the solar battery module M in operation) as the state in which one solar battery cell (for example, the solar battery cell C1) of the solar battery cells C1, C2, C3, C4, and C5 is shielded from light (the light-shielded state of the solar battery module M). As a result, a light generation current of the solar battery cell C1 is lower than light generation currents of the other solar battery cells C2, C3, C4, and C5.

In an example of the solar battery cell operation voltage estimation system 1, the light-shielded state setting unit 13 attaches a mask (not shown) to the solar battery cell C1, so that the state of the solar battery module M is set as the state in which the solar battery cell C1 is shielded from light.

In another example of the solar battery cell operation voltage estimation system 1, the light-shielded state setting unit 13 attaches a net (not shown) to the solar battery cell C1, so that the state of the solar battery module M is set as the state in which the solar battery cell C1 is shielded from light.

In a still another example of the solar battery cell operation voltage estimation system 1, the light-shielded state setting unit 13 disposes a light-shielding object (not shown), so that the state of the solar battery module M is set as the state in which the solar battery cell C1 is shielded from light.

In the example shown in FIG. 5, next, in the state in which the solar battery cell C1 is shielded from light, the modulated light irradiation unit 11 irradiates the solar battery cell C1 with the modulated light ML.

Further, in the state in which the solar battery cell C1 is shielded from light and the modulated light irradiation unit 11 irradiates the solar battery cell C1 with the modulated light ML, the output current small change detection unit 12 detects the small change $\Delta I_s$ of the output current of the solar battery module M.

In the example shown in FIG. 5, next, in the state in which the solar battery cell C1 is shielded from light, the modulated light irradiation unit 11 irradiates each of the solar battery cells C2, C3, C4, and C5 except for the solar battery cell C1 among the solar battery cells C1, C2, C3, C4, and C5 with the modulated light ML. Specifically, an irradiation state of the modulated light ML is adjusted so that values of the light generation current (amplitude of the modulated light) $\Delta I_{ph}$ derived from the modulated light in equivalent circuits of the solar battery cells C2, C3, C4, C5 are equal one another.

The small change $\Delta I$ of the output current of the solar battery module M is also proportional to the light generation current (amplitude of the modulated light) $\Delta I_{ph}$ derived from the modulated light. The light generation current (amplitude of the modulated light) $\Delta I_{ph}$ derived from the modulated light changes according to the irradiation state of the modulated light ML. Therefore, unless the light generation current (amplitude of the modulated light) $\Delta I_{ph}$ derived from the modulated light is constant, it is difficult to perform comparison of the small change $\Delta I$ of the output current of the solar battery module M. Therefore, in a case where the fact that the operation voltage of the solar battery cells C2, C3, C4, and C5, which are not shielded from light, in the solar battery module M in the light-shielded state, is the same open circuit voltage $v_{OC}$ is used and one solar battery cell whose irradiation state of the modulated light ML is shielded from light is sequentially replaced and adjusted so that the small change $\Delta I$ of the output current of the solar battery module M is equal at the same open circuit voltage $v_{OC}$, the light generation current (amplitude of the modulated light) $\Delta I_{ph}$ derived from the modulated light can be equivalent in the adjusted solar battery cells C1, C2, C3, C4, and C5.

Further, in the example shown in FIG. 5, in the state in which the solar battery cell C1 is shielded from light and the modulated light irradiation unit 11 irradiates any of the solar battery cells C2, C3, C4, and C5 with the modulated light ML, the output current small change detection unit 12 detects the small change $\Delta I_i$ of the output current of the solar battery module M.

Specifically, in the state in which the solar battery cell C1 is shielded from light and the modulated light irradiation unit 11 irradiates the solar battery cell C2 with the modulated light ML, the output current small change detection unit 12 detects the small change $\Delta I_i$ of the output current of the solar battery module M. Further, in the state in which the solar battery cell C1 is shielded from light and the modulated light irradiation unit 11 irradiates the solar battery cell C3 with the modulated light ML, the output current small change detection unit 12 detects the small change $\Delta I_i$ of the output current of the solar battery module M. Further, in the state in which the solar battery cell C1 is shielded from light and the modulated light irradiation unit 11 irradiates the solar battery cell C4 with the modulated light ML, the output current small change detection unit 12 detects the small change $\Delta I_i$ of the output current of the solar battery module M. Further, in the state in which the solar battery cell C1 is shielded from light and the modulated light irradiation unit 11 irradiates the solar battery cell C5 with the modulated light ML, the output current small change detection unit 12 detects the small change $\Delta I_i$ of the output current of the solar battery module M.

Further, in the example shown in FIG. 5, in the state in which the solar battery cell C1 is shielded from light, the solar battery module operation voltage detection unit 14 detects the operation voltage $V_S$ of the solar battery module M (voltage of an output terminal of the solar battery module M).

Next, the calibration line generation unit 15 estimates the operation voltage of the solar battery cells C1, C2, C3, C4, and C5 based on the above-described principle. Further, the calibration line generation unit 15 plots a first point P1 and a second point P2 on, for example, the coordinate axes in which the horizontal axis is set as the voltage and the vertical axis is set as the relative ratio of the resistor.

Figure 6:
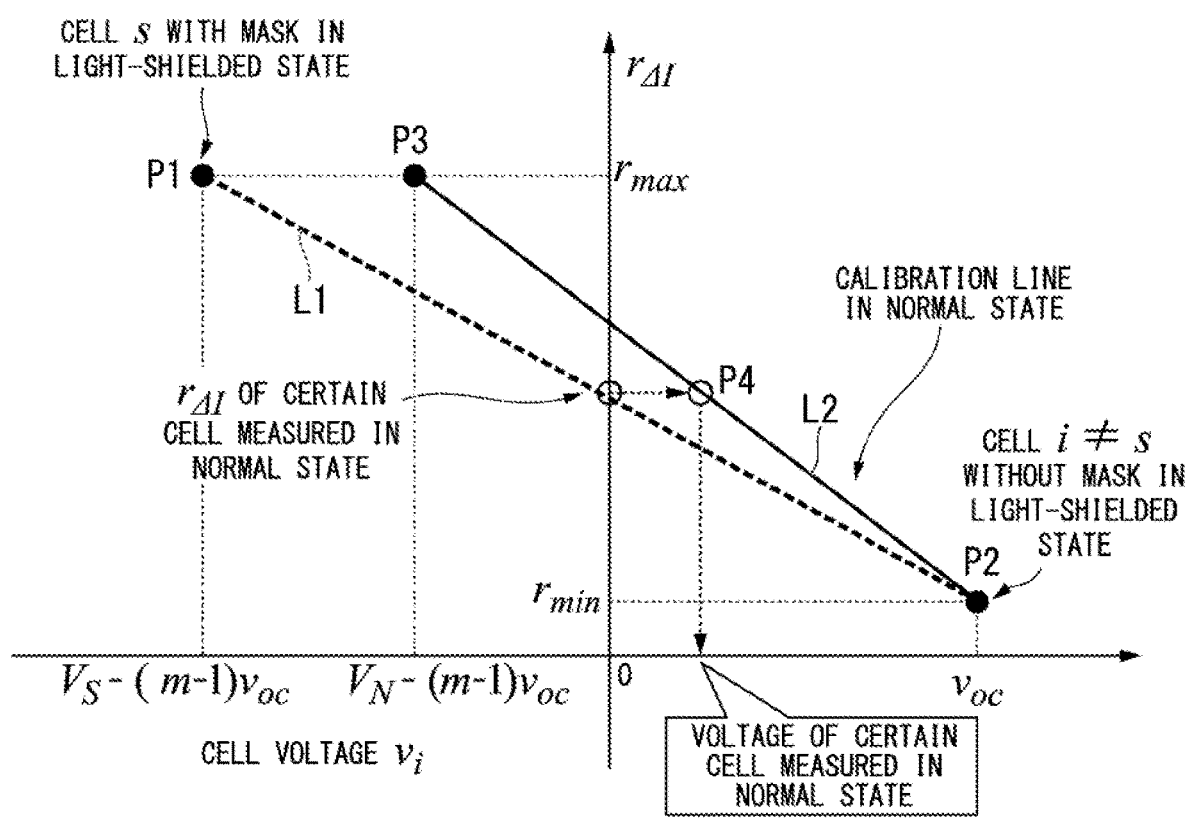
FIG. 6 is a diagram for explaining an example of a first point, a second point, and the like which are plotted by a calibration line generation unit.

FIG. 6 is a diagram for explaining an example of the first point P1 and the second point P2 plotted by the calibration line generation unit 15. In FIG. 6, a horizontal axis shows the operation voltage v of the solar battery cells C1, C2, C3, C4, and C5, and a vertical axis shows the relative ratio $r_{\Delta I}(=\Delta I/\Delta I_{ph})$ of the resistor of the solar battery cells C1, C2, C3, C4, and C5.

In FIG. 6, the first point P1 shows a relationship between the value $V_S-(m-1)v_{OC}$ of the operation voltage v (cell voltage) of the solar battery cell C1 (light-shielded cell s) which is shielded from light and a value $r_{max}$ ($=r_{\Delta Is}$) of the relative ratio $r_{\Delta I}$ of the resistor in the light-shielded state of the solar battery module M. That is, the coordinates of the first point P1 are $(V_S-(m-1)v_{OC}, r_{max})$.

The value $V_S-(m-1)v_{OC}$ of the horizontal axis of the first point P1 is obtained by subtracting a total value $(m-1)v_{OC}$ of the open circuit voltage $v_{OC}$ of each of the solar battery cells C2, C3, C4, and C5 from the operation voltage $V_S$ of the solar battery module M in the state in which the solar battery cell C1 is shielded from light.

The value $r_{\Delta Is}$ of the vertical axis of the first point P1 is the maximum value $r_{max}$ of the relative ratio $r_{\Delta I}$ of the resistor of the solar battery cells C1, C2, C3, C4, C5.

The second point P2 shows a relationship between a value $v_{OC}$ of the operation voltage v (cell voltage $v_i$) of the solar battery cell (for example, the solar battery cell C3) which is not shielded from light in the light-shielded state of the solar battery module M and a value $r_{min}(r_{\Delta Ii})$ of the relative ratio $r_{\Delta I}$ of the resistor. That is, the coordinates of the second point P2 are $(v_{OC}, r_{min})$.

The value $v_{OC}$ of the horizontal axis of the second point P2 is the open circuit voltage $v_{OC}$ of each of the solar battery cells C2, C3, C4, and C5.

The value $r_{\Delta Ii}$ of the vertical axis of the second point P2 is a minimum value $r_{min}$ of the relative ratio $r_{\Delta I}$ of the resistor of the solar battery cells C1, C2, C3, C4, C5.

In the example shown in FIG. 5, next, the calibration line generation unit 15 generates a first calibration line L1 (see FIG. 6) by connecting the first point P1 ($V_S-(m-1)v_{OC}$, $r_{\Delta Is}$) and the second point P2 ($v_{OC}$, $r_{\Delta Ii}$).

In the example shown in FIG. 5, next, the light-shielded state setting unit 13 sets the state of the solar battery module M as a state in which none of the solar battery cells C1, C2, C3, C4, and C5 is shielded from light (normal state).

Next, in the state in which none of the solar battery cells C1, C2, C3, C4, and C5 is shielded from light, the modulated light irradiation unit 11 irradiates the solar battery cell Ck (for example, the solar battery cell C3) the operation voltage of which is to be estimated among the solar battery cells C1, C2, C3, C4, and C5 with the modulated light ML.

Further, in the state in which none of the solar battery cells C1, C2, C3, C4, and C5 is shielded from light and the modulated light irradiation unit 11 irradiates the solar battery cell Ck (for example, the solar battery cell C3) the operation voltage of which is to be estimated among the solar battery cells C1, C2, C3, C4, and C5 with the modulated light ML, the output current small change detection unit 12 detects a small change $\Delta I_k$ of the output current of the solar battery module M.

Further, in the state in which none of the solar battery cells C1, C2, C3, C4, and C5 is shielded from light, the modulated light irradiation unit 11 irradiates the solar battery cell Cj≠k (for example, any of the solar battery cells C1, C2, C4, and C5) other than the solar battery cell Ck (for example, the solar battery cell C3) the operation voltage of which is to be estimated among the solar battery cells C1, C2, C3, C4, and C5 with the modulated light ML.

Further, in the state in which none of the solar battery cells C1, C2, C3, C4, and C5 is shielded from light and the modulated light irradiation unit 11 irradiates the solar battery cell Cj≠k (for example, any of the solar battery cells C1, C2, C4, and C5) other than the solar battery cell Ck (for example, the solar battery cell C3) the operation voltage of which is to be estimated among the solar battery cells C1, C2, C3, C4, and C5 with the modulated light ML, the output current small change detection unit 12 detects a small change $\Delta I_{j\neq k}$ of the output current of the solar battery module M.

Further, in the example shown in FIG. 5, in the state in which none of the solar battery cells C1, C2, C3, C4, and C5 is shielded from light, the solar battery module operation voltage detection unit 14 detects an operation voltage $V_N$ of the solar battery module M.

Next, the calibration line generation unit 15 plots a third point P3 on the coordinate axes shown in FIG. 6.

As shown in FIG. 6, a value $V_N-(m-1)\ v_{OC}$ of the horizontal axis of the third point P3 is obtained by subtracting a total value $(m-1)v_{OC}$ of the open circuit voltage $v_{OC}$ of each of the solar battery cells C2, C3, C4, and C5 from the operation voltage $V_N$ of the solar battery module M in the state in which none of the solar battery cells C1, C2, C3, C4, and C5 is shielded from light.

The value $r_{\Delta Is}$ of the vertical axis of the third point P3 is the maximum value $r_{max}$ of the relative ratio $r_{\Delta I}$ of the resistor of the solar battery cells C1, C2, C3, C4, C5. That is, the value $r_{\Delta Is}$ of the vertical axis of the third point P3 is equal to the value $r_{\Delta Is}$ of the vertical axis of the first point P1.

In the example shown in FIG. 5, next, the calibration line generation unit 15 generates a second calibration line L2 (see FIG. 6) by connecting the third point P3 ($V_N-(m-1)v_{OC}$, $r_{\Delta Is}$) and the second point P2 ($v_{OC}$, $r_{\Delta Ii}$).

Next, the resistor relative ratio calculation unit 16 calculates a value $r_{\Delta Ik}$ of the relative ratio r of the resistor of the solar battery cell Ck the operation voltage of which is to be estimated.

In a first example of the solar battery cell operation voltage estimation system 1 of the first embodiment, the resistor relative ratio calculation unit 16 calculates as the value $r_{\Delta Ik}$ of the relative ratio r of the resistor of the solar battery cell Ck the operation voltage of which is to be estimated, $(R_k/\Sigma R_j+R)$ obtained by dividing the value $R_k$ of the differential resistance of the solar battery cell Ck (any of the solar battery cells C2, C3, C4, and C5) the operation voltage of which is to be estimated by a sum $(\Sigma R_j+R)$ of the total value $\Sigma R_j$ of the differential resistances of all the solar battery cells C1, C2, C3, C4, and C5 and the resistance value R of the load resistor RL connected in series to the solar battery module M.

In a second example of the solar battery cell operation voltage estimation system 1 of the first embodiment, the lock-in amplifier 12a of the output current small change detection unit 12 detects a small change $\Delta I_i$ of the output current of the solar battery module M in the state in which the solar battery cell C1 is shielded from light and the small change $\Delta I_k$ of the output current of the solar battery module M in the state in which none of the solar battery cells C1 C2, C3, C4, C5 is shielded from light.

Further, the resistor relative ratio calculation unit 16 calculates, as the value $r_{\Delta Ik}$ of the relative ratio r of the resistor of the solar battery cell Ck the operation voltage of which is to be estimated, a value $(\Delta I_k/(\Delta I_k+\Sigma_{j\neq k}\Delta I_j))$ of the lock-in amplifier ratio $r_{\Delta I}$ (specifically, the lock-in amplifier ratio $r_{\Delta I}$ for the small change $\Delta I$ of the output current of the solar battery module M in the solar battery cell Ck).

Specifically, the calibration line generation unit 15 calculates a value $(\Delta I_s/(\Delta I_s+\Sigma_{i\neq s}\Delta I_i))$ as the value of the vertical axis of the first point P1 (see FIG. 6).

Further, the calibration line generation unit 15 calculates a value $(\Delta I_i/(\Delta I_s+\Sigma_{i\neq s}\Delta I_i))$ as the value of the vertical axis of the second point P2 (see FIG. 6).

The resistor relative ratio calculation unit 16 calculates a value $(\Delta I_k/(\Delta I_k+\Sigma_{j\neq k}\Delta I_j))$ as a value that becomes a value of the vertical axis of a fourth point P4 (see FIG. 6), which will be described later.

In the second example of the solar battery cell operation voltage estimation system 1 of the first embodiment, the total value $\Sigma R_j$ of the differential resistances of all the solar battery cells C1, C2, C3, C4, and C5 need not be obtained in advance. In a case where the operation voltage of the solar battery cells C1, C2, C3, C4, C5 is not near the open circuit voltage $v_{OC}$, because the total value $\Sigma R_j$ of the differential resistances of all the solar battery cells C1, C2, C3, C4, and C5 is larger than the resistance value R of the load resistor RL, there is no problem.

In a third example of the solar battery cell operation voltage estimation system 1 of the first embodiment, the resistor relative ratio calculation unit 16 calculates a standardized value as the value $r_{\Delta Ik}$ of the relative ratio r of the resistor of the solar battery cell Ck the operation voltage of which is to be estimated.

The standardized value is a value ($\Delta I$/the maximum of $\Delta I$ indicated by the light-shielded cell) obtained by dividing a value $R_i(\Delta I)$ of the differential resistance of any of the solar battery cells C2, C3, C4, and C5 by the maximum value (the maximum of $\Delta I$ indicated by the light-shielded cell) of the differential resistance of the solar battery cell C1 in the light-shielded state.

In a fourth example of the solar battery cell operation voltage estimation system 1 of the first embodiment, the resistor relative ratio calculation unit 16 calculates a standardized value (specifically, an improved standardized value) as the value $r_{\Delta Ik}$ of the relative ratio r of the resistor of the solar battery cell Ck the operation voltage of which is to be estimated.

The improved standardized value is a value ($\Delta I$/(the maximum of $\Delta I$ indicated by the light-shielded cell+(m−1))×$\Delta I$ indicated by one cell having the open circuit voltage $v_{OC}$)) obtained by dividing a value $R_i(\Delta I)$ of the differential resistance of any of the solar battery cells C2, C3, C4, and C5 by the sum of the maximum value (the maximum $\Delta I$ indicated by the light-shielded cell) of the solar battery cell C1 in the light-shielded state and the value of the differential resistance of any of the solar battery cell C2, C3, C4, and C5.

In the example shown in FIG. 5, next, the solar battery cell operation voltage calculation unit 17 calculates a fourth point P4 (see FIG. 6), which is a point on the calibration line L2 whose value of the vertical axis is the value $r_{\Delta Ik}$ of the relative ratio r of the resistor of the solar battery cell Ck the operation voltage of which is to be estimated.

Next, the solar battery cell operation voltage calculation unit 17 calculates a value of the horizontal axis of the fourth point P4 as an operation voltage $v_k$ of the solar battery cell Ck which is to be estimated.

Figure 7:
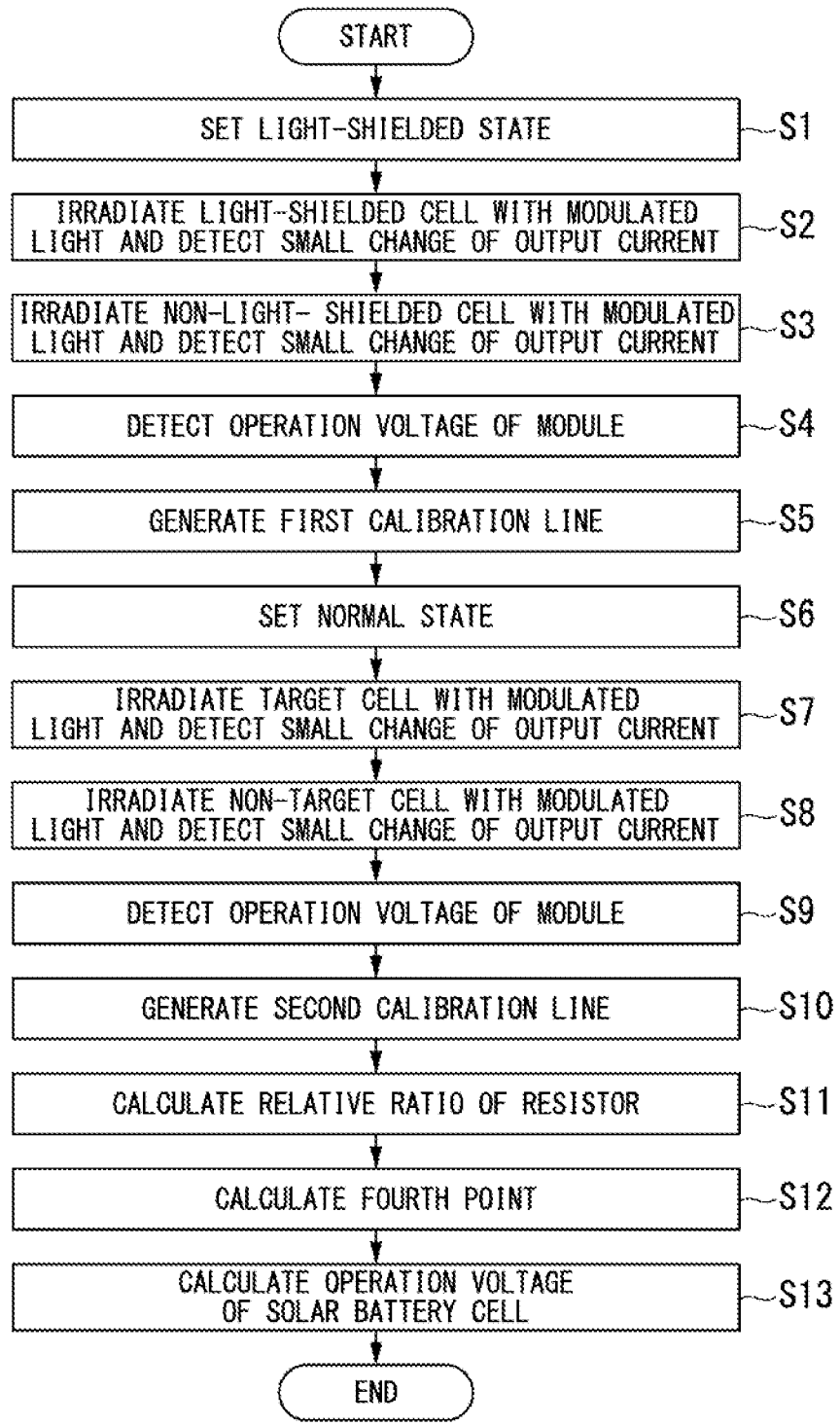
FIG. 7 is a flowchart for explaining an example of processing executed in the solar battery cell operation voltage estimation system of the first embodiment.

FIG. 7 is a flowchart for explaining an example of processing executed in the solar battery cell operation voltage estimation system 1 of the first embodiment.

In the example shown in FIG. 7, in step S1, the light-shielded state setting unit 13 sets the state of the solar battery module M as a state in which one solar battery cell (for example, the solar battery cell C1) of the solar battery cells C1, C2, C3, C4, and C5 is shielded from light (the light-shielded state of the solar battery module M).

Next, in step S2, in the state in which the solar battery cell C1 is shielded from light, the modulated light irradiation unit 11 irradiates the solar battery cell C1 with the modulated light ML, and the output current small change detection unit 12 detects the small change $\Delta I_s$ of the output current of the solar battery module M.

Next, in step S3, in the state in which the solar battery cell C1 is shielded from light, the modulated light irradiation unit 11 irradiates any of the solar battery cells C2, C3, C4, and C5 with the modulated light ML, and the output current small change detection unit 12 detects the small change $\Delta I_i$ of the output current of the solar battery module M.

Next, in step S4, in the state in which the solar battery cell C1 is shielded from light, the solar battery module operation voltage detection unit 14 detects the operation voltage $V_S$ of the solar battery module M.

Next, in step S5, the calibration line generation unit 15 plots, for example, the first point P1 and the second point P2 on the coordinate axes in which the horizontal axis is set as the voltage and the vertical axis is set as the relative ratio of the resistor, and generates the first calibration line L1 by connecting the first point P1 and the second point P2.

Next, in step S6, the light-shielded state setting unit 13 sets the state of the solar battery module M as a state in which none of the solar battery cells C1, C2, C3, C4, and C5 is shielded from light (normal state).

Next, in step S7, in the state in which none of the solar battery cells C1, C2, C3, C4, and C5 is shielded from light, the modulated light irradiation unit 11 irradiates the solar battery cell Ck (for example, the solar battery cell C3) the operation voltage of which is to be estimated among the solar battery cells C1, C2, C3, C4, and C5 with the modulated light ML, and the output current small change detection unit 12 detects the small change $\Delta I_k$ of the output current of the solar battery module M.

Next, in step S8, in the state in which none of the solar battery cells C1, C2, C3, C4, and C5 is shielded from light, the modulated light irradiation unit 11 irradiates the solar battery cell Cj≠k (for example, any of the solar battery cells C1, C2, C4, and C5) other than the solar battery cell Ck (for example, the solar battery cell C3) the operation voltage of which is to be estimated among the solar battery cells C1, C2, C3, C4, and C5 with the modulated light ML, and the output current small change detection unit 12 detects a small change $\Delta I_k$ of the output current of the solar battery module M.

Next, in step S9, in the state in which none of the solar battery cells C1, C2, C3, C4, C5 is shielded from light, the solar battery module operation voltage detection unit 14 detects the operation voltage $V_N$ of the solar battery module M.

Next, in step S10, the calibration line generation unit 15 plots the third point P3 on the coordinate axes and generates the second calibration line L2 by connecting the third point P3 and the second point P2.

Next, in step S11, the resistor relative ratio calculation unit 16 calculates a value $r_{\Delta Ik}$ of the relative ratio r of the resistor of the solar battery cell Ck the operation voltage of which is to be estimated.

Next, in step S12, the solar battery cell operation voltage calculation unit 17 calculates the fourth point P4 that is the point whose value of the vertical axis is the value $r_{\Delta Ik}$ of the relative ratio r of the resistor of the solar battery cell Ck the operation voltage of which is to be estimated on the second calibration line L2.

Next, in step S13, the solar battery cell operation voltage calculation unit 17 calculates the value of the horizontal axis of the fourth point P4 as the operation voltage $v_k$ of the solar battery cell Ck which is to be estimated.

As described above, according to the solar battery cell operation voltage estimation system 1 of the first embodiment, it is possible to estimate the operation voltage $v_k$, which cannot be found in the related art, of the solar battery cells C1, C2, C3, C4, and C5 connected in series in the solar battery module M.

Second Embodiment

Hereinafter, a second embodiment of a method for estimating an operation voltage of a solar battery cell in a solar battery module and a solar battery cell operation voltage estimation system of the present invention will be described.

The solar battery cell operation voltage estimation system 1 of the second embodiment is configured in the same manner as the solar battery cell operation voltage estimation system 1 of the first embodiment described above, except for points which will be described later. Therefore, according to the solar battery cell operation voltage estimation system 1 of the second embodiment, it is possible to obtain the same effect as that of the solar battery cell operation voltage estimation system 1 of the first embodiment described above except for the points which will be described later.

In the solar battery cell operation voltage estimation system 1 of the first embodiment, the solar battery cells C1, C2, C3, C4, and C5 are irradiated with the modulated light ML reflected by the reflector 114 of the modulated light irradiation unit 11. That is, in the solar battery cell operation voltage estimation system 1 of the first embodiment, an irradiation direction of the modulated light ML is controlled by the reflector 114. Further, in an application example (example shown in FIG. 5) of the solar battery cell operation voltage estimation system 1 of the first embodiment, the plurality of solar battery cells C1, C2, C3, C4, and C5 connected in series are linearly arranged.

On the other hand, in the solar battery cell operation voltage estimation system 1 of the second embodiment, the modulated light irradiation unit 11 includes a three-dimensional (3D) laser scanner (not shown). That is, in the solar battery cell operation voltage estimation system 1 of the second embodiment, the irradiation direction (emission direction) of the modulated light ML is controlled by the 3D laser scanner. Further, in an application example of the solar battery cell operation voltage estimation system 1 of the second embodiment, the plurality of solar battery cells connected in series are arranged in an array shape (grid shape).

The 3D laser scanner measures a distance using a time of flight (TOF) method for measuring a time taken for a laser pulse to reciprocate between a measurement target point and a sensor, and at the same time, measures the emission direction of a laser beam, thereby obtaining 3D coordinates of the measurement target point. A large number of data points can be obtained in one scan. Recently, 3D laser scanners have been applied to 3D measurement of various terrains and buildings.

In the application example of the solar battery cell operation voltage estimation system 1 of the second embodiment, a solar battery module group includes a plurality of solar battery modules M. The solar battery module group includes a plurality of solar battery cells (solar battery cell group) arranged in the array shape. For example, the 3D laser scanner using the TOF method is applied to irradiate the plurality of solar battery cells (solar battery cell group) with modulated light ML.

In the application example of the solar battery cell operation voltage estimation system 1 of the second embodiment, the 3D laser scanner using the TOF method performs measurement (an example of a pulse repetition rate: 100 kHz to 1 MHz) by repeatedly irradiating the plurality of solar battery cells (solar battery cell group) with pulses.

In the application example of the solar battery cell operation voltage estimation system 1 of the second embodiment, a database, which records the irradiation direction and an irradiation time of the pulse, is combined with a database which records an output of the lock-in amplifier 12a to which the signal of the alternating current clamp sensor 18 connected to an output wiring from the solar battery cell array (solar battery cell group) is input. That is, a position of the solar battery cell scanned by the 3D laser scanner is associated with the output of the lock-in amplifier 12a. As a result, the operation voltage of each solar battery cell included in the solar battery cell group can be found (measured).

Specifically, in the application example of the solar battery cell operation voltage estimation system 1 of the second embodiment, the laser light that can be absorbed by the solar battery cell is irradiated by the 3D laser scanner. In a case where the solar battery cell operation voltage estimation system 1 is applied to the solar battery module group in which a silicon solar battery cell is used as the solar battery cell, a silicon bandgap (approximately, 1.2 eV) included in the silicon solar battery cell is taken into consideration, so that laser light having a wavelength approximately equal to or less than 1030 nm that can be absorbed by silicon is irradiated from the 3D laser scanner. Further, since a part of the laser light irradiated from the 3D laser scanner is absorbed by the silicon solar battery cell, an intensity of the laser light irradiated from the 3D laser scanner is set to a large value to secure an intensity of the reflected light from the silicon solar battery cell to the 3D laser scanner.

As described above, according to the solar battery cell operation voltage estimation system 1 of the first and second embodiments, the operation voltage of the solar battery cells C1, C2, C3, C4, and C5 which are sealed inside the solar battery module M in operation can be estimated quantitatively.

EXAMPLES

Although the present invention will be described in detail below with reference to examples, the present invention is not limited to the examples, and the present invention can be appropriately modified and realized without departing from the scope thereof.

In the examples, the following experimental materials are used in common.

Lock-in amplifier: NF circuit block LI-575
Example 1, Example 2, Example 3: a sensitivity of 1 mV, a time constant of 1.25 s, an input of the current clamp sensor clamped in a contactless manner to a 32-turn coil connected in series to the load resistor
Example 4: a sensitivity of 10 mV, a time constant of 1.25 s, the voltage (module voltage) of the load resistor is directly input to the lock-in amplifier
He—Ne laser: JDSU NOVETTE 0.5 mW random polarized light, ND1 filter
Chopper frequency: Approximately 330 Hz
Various types of voltage measurement: high-speed analog measurement unit NR-HA08 of Keyence data logger NR-600
Solar battery: a module in which five ETMP 250-0.5 V made in China are connected in series (assuming that the open circuit voltage of each cell is $v_{OC}$=0.50 V)
Simulated solar light: LED lights made by Sunway
Approximately 140 W/m$^2$ in Example 1, Example 2, and Example 3
Approximately 100 W/m$^2$ in Example 4

Example 1

An average cell voltage of each cell and a lock-in amplifier ratio $r_{AI}$ are measured at module voltages $V_m$=0.05, 0.08 to 0.09, and 1.29 V. FIG. 3 described above shows a measurement result of Example 1.

In a case where the module voltage $V_m$=0.05 V, a sufficient light-shielding mask is applied to create the calibration line. In a case where the module voltage $V_m$=0.08 to 0.09 V, the voltage of each cell is changed with an insufficient light-shielding mask or without the light-shielding mask. Further, in the case of the module voltage $V_m$=1.29 V, the module voltage is increased by increasing the load resistor without the light-shielding mask.

As shown in FIG. 3, for data of the module voltage $V_m$=0.05 V at which the calibration line is created, a predicted value of the cell voltage ($V_m$−4 $v_{OC}$, $v_{OC}$)=(−1.95 V, 0.5 V) is close to the minimum or maximum voltage (−1.89 V, 0.49 V) of actual measurement data.

Furthermore, in a case where the calibration line is estimated at an arbitrary module voltage using the lock-in amplifier ratio $r_{AI}$ at the module voltage of 0.05 V and the open circuit voltage $v_{OC}$=0.50 V of the cell, an estimation voltage corresponding to the lock-in amplifier ratio $r_{AI}$ of actual measurement data "○" (module voltage 1.29 V) and "▲" (module voltage 0.08 to 0.09 V) is close to a voltage of the actual measurement data. This is considered to indicate validity of the present invention.

Example 2

Figure 8:
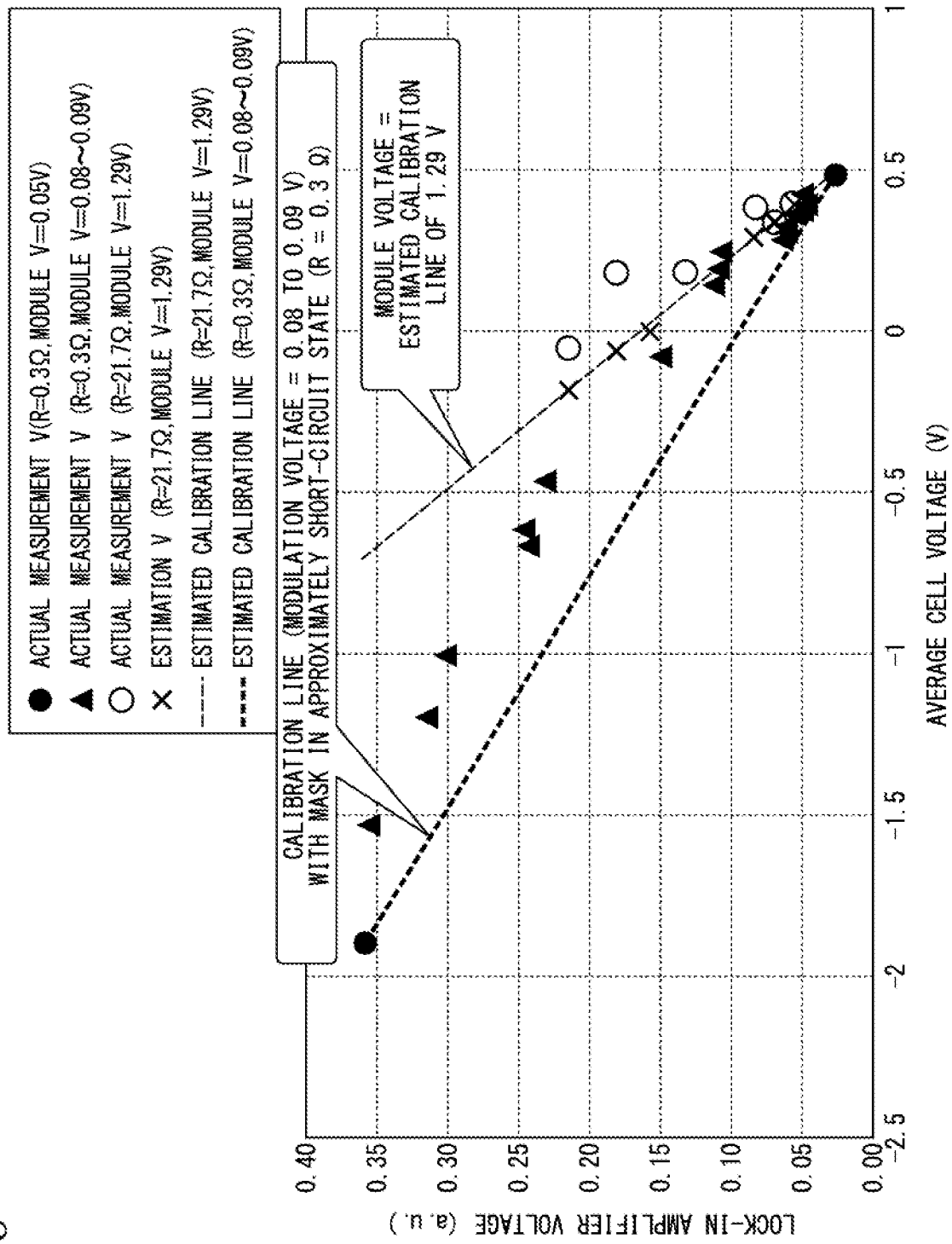
FIG. 8 is a diagram showing measurement data of Example 2

FIG. 8 is a diagram showing the measurement data of Example 2. A horizontal axis of FIG. 8 shows an average operation voltage [V] of the solar battery cell, and a vertical axis shows a lock-in amplifier value ΔI (lock-in amplifier voltage (a.u.)).

In Example 2, using the data of Example 1, the average cell voltage of each cell at the voltages $V_m$=0.05, 0.08 to 0.09, and 1.29 V of the module, to which the light-shielding mask is attached, and the lock-in amplifier value ΔI are summarized in FIG. 8.

For the data of the voltage $V_m$=0.05 V of the module in which the calibration line is created, the predicted value of the cell voltage $(V_m-4\ v_{OC}, v_{OC})$=(−1.95 V, 0.50 V) is close to the maximum and minimum voltages (−1.89 V, 0.49 V) of the actual measurement data.

In a case where the calibration line is estimated by the value ΔI (standardized value ΔI) standardized by the maximum value of the lock-in amplifier value ΔI at a module voltage of 0.05 V, a deviation is shown in the estimated calibration line of both the actual measurement data "▲" (module voltage 0.08 to 0.09 V) and the actual measurement data "○" (module voltage 1.29 V), compared to Example 1.

Although the calibration line according to the standardized value ΔI is inferior to the calibration line according to the lock-in amplifier ratio $r_{\Delta I}$, it is considered that a calibration line based on the standardized value ΔI can be used as an alternative of a case where the lock-in amplifier value ΔI of all the cells cannot be measured. In the following Example 3, since estimation is possible with the calibration line based on the standardized value ΔI, it is necessary to further examine a condition under which the calibration line of the standardized value ΔI can be used well.

Example 3

Figure 9:
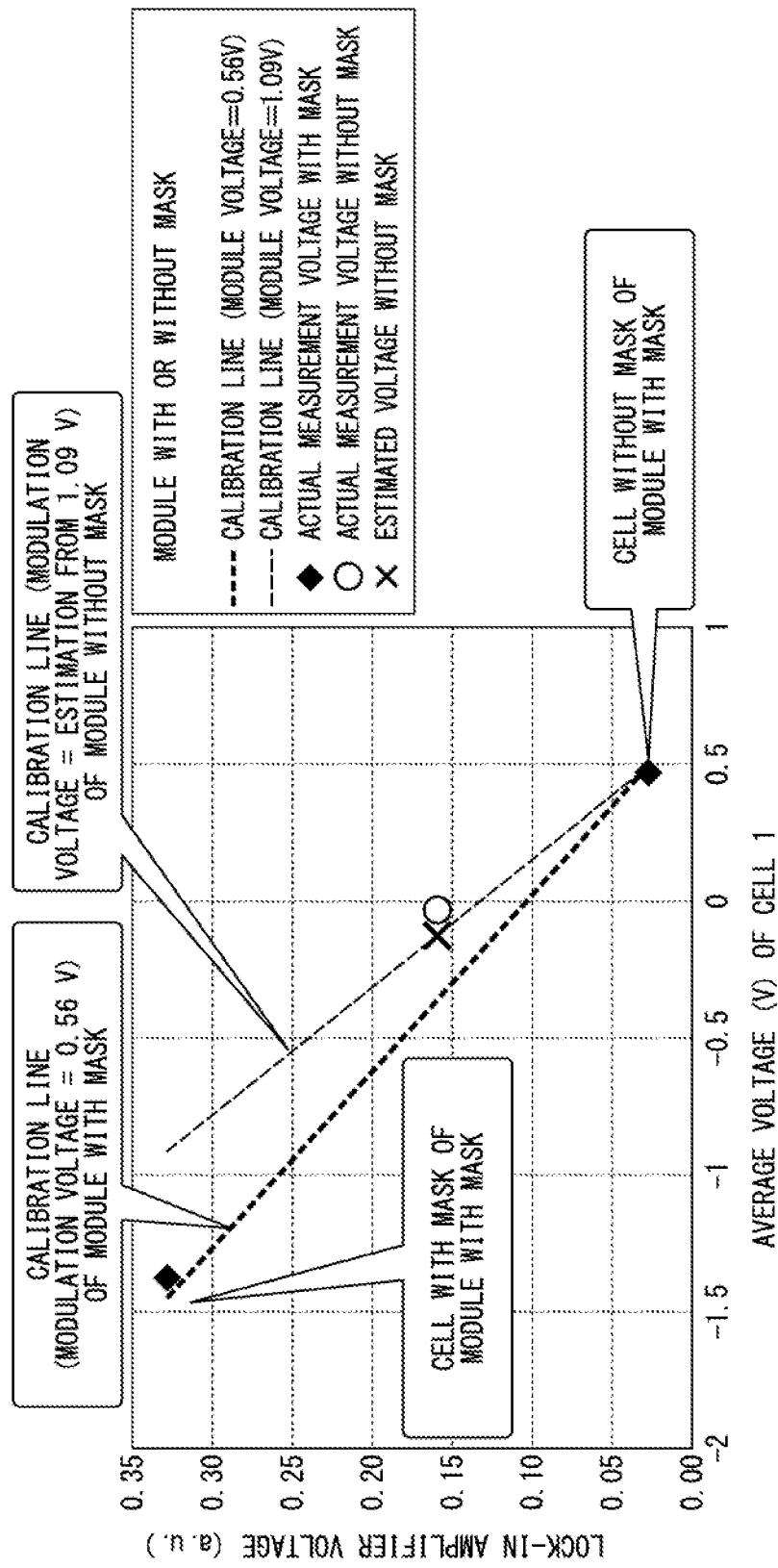
FIG. 9 is a diagram showing measurement data of Example 3.

FIG. 9 is a diagram showing measurement data of Example 3. A horizontal axis of FIG. 9 shows the average operation voltage [V] of the solar battery cell, and a vertical axis shows the lock-in amplifier value ΔI (lock-in amplifier voltage (a.u.)).

In Example 3, the average cell voltage of each cell at the voltages $V_m$=0.56, 1.09 V of the module and the lock-in amplifier value ΔI are summarized in FIG. 9.

In a case where the module voltage $V_m$=0.56 V, the sufficient light-shielding mask is applied to create the calibration line. However, in a case where the module voltage $V_m$=1.09 V, the voltage of each cell is changed without the light-shielding mask.

For the data of the voltage $V_m$=0.56 V of the module in which the calibration line is created, the predicted value of the cell voltage $(V_m-4\ v_{OC}, v_{OC})$=(−1.44 V, 0.50 V) is close to the minimum and maximum voltages (−1.38 V, 0.47 V) of the actual measurement data.

In a case where the calibration line is estimated by the value ΔI (standardized value ΔI) standardized by the maximum value of the lock-in amplifier value ΔI at a module voltage of 0.56 V, an estimation value "x", which is close to the actual measurement data "o" (module voltage 1.09 V), is output.

However, since the estimation cannot be performed well in Example 2, it is necessary to further examine a condition under which the calibration line of the standardized value ΔI can be used well.

Example 4

Figure 11:
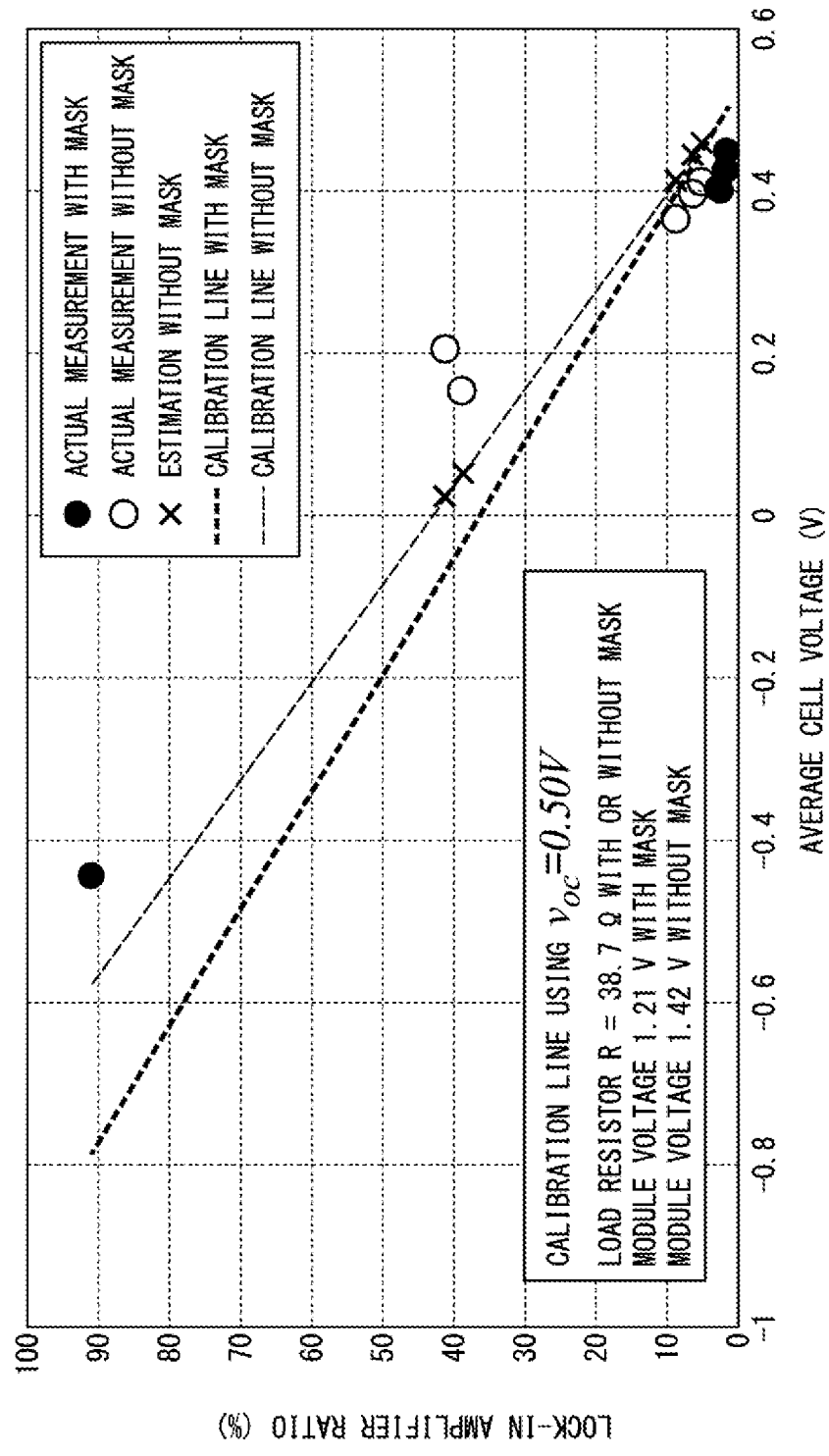
FIG. 11 is a diagram showing other measurement data of Example 4.

FIG. 10 is a diagram showing the measurement data of Example 4. FIG. 11 is a diagram showing other measurement data of Example 4. Horizontal axes of FIGS. 10 and 11 indicate the average operation voltage [V] of the solar battery cell, and the vertical axes indicate the lock-in amplifier ratio $r_{\Delta I}$.

In Example 4, a ratio $r_{\Delta I}$ of the average cell voltage of each cell to the lock-in amplifier is measured at the voltages of 1.21, 1.42 V of the module.

In a case where the module voltage $V_m$=1.21 V, the light-shielding mask is sufficiently applied to create the calibration line. However, in a case where the module voltage $V_m$=1.42 V, the voltage of each cell is changed without the light-shielding mask.

For the data of the voltage $V_m$=1.21 V of the module in which the calibration line is created, the predicted value of the cell voltage $(V_m-4\ v_{OC}, v_{OC})$=(−0.79 V, 0.50 V) becomes both-end voltage (−0.42 V, 0.42 V) of the actual measurement data, and a deviation is shown.

Therefore, in a case where the actual open circuit voltage $v_{OC}$=0.42 V, the predicted value of the cell voltage $(V_m-4\ v_{OC}, v_{OC})$=(−0.47 V, 0.42 V) is close to the both-end voltage (−0.42 V, 0.42 V) of the actual measurement data.

A result of estimation of the calibration line obtained by assuming the open circuit voltage $v_{OC}$=0.42 V is as shown in FIG. 10, and an estimation value "x", which is close to the voltage "○" of the actual measurement data at the module voltage of 1.42 V, is output.

That is, in a result of estimation using the calibration line obtained by assuming the predicted value $(V_m-4\ v_{OC}, v_{OC})$=(−0.79 V, 0.50 V) of the cell voltage at the open circuit voltage $v_{OC}$=0.50 V, the estimated calibration line is deviated significantly from the actual measurement data, as shown in FIG. 11. The fact that the open circuit voltage $v_{OC}$ is slightly decreased due to the decrease in an intensity of the simulated solar light is considered as a cause. Therefore, it is necessary to apply the open circuit voltage $v_{OC}$ as accurately as possible in advance.

Although the embodiments of the present invention have been described above in detail with reference to the drawings, a specific configuration is not limited to the embodiments and can be appropriately modified without departing from the gist of the present invention. The configurations described in each of the embodiments and each of the examples described above may be combined.

Note that all or a part of the solar battery cell operation voltage estimation system 1 in the above-described embodiment may be realized by dedicated hardware, or may be realized by a memory and a microprocessor.

Note that all or a part of the solar battery cell operation voltage estimation system 1 may include a memory and a central processing unit (CPU), and functions thereof may be realized by loading and executing a program for realizing the functions of the units included in each system in the memory.

Note that processing of each unit may be performed by recording a program for realizing all or some of the functions of the solar battery cell operation voltage estimation system 1 on a computer-readable recording medium, and reading and executing the program recorded on the recording medium in the computer system. Note that, here, the "computer system" includes an OS and hardware such as a peripheral device. Further, the "computer system" includes a homepage providing environment (or a display environment) in a case where a WWW system is used.

In addition, "computer-readable recording medium" refers to a portable medium, such as a flexible disk, a magneto-optical disc, a ROM, or a CD-ROM, or a storage device such as a hard disk built in the computer system. Further, "computer-readable recording medium" includes a medium which dynamically holds a program for a short time like a communication line in a case of transmitting the program through a network such as the Internet or a communication line such as a telephone line, and a medium which holds a program for a certain period of time like a volatile memory in the computer system serving as a server or a client in that case. In addition, the above-described program may be provided to realize some of the above-described functions, or may be realized by combining the above-described functions with a program already recorded in the computer system.

REFERENCE SIGNS LIST

1: Solar battery cell operation voltage estimation system
11: Modulated light irradiation unit
111: Laser light irradiation unit
112: Light chopper unit
113: Chopper control unit
114: Reflector
115: Filter
12: Output current small change detection unit
12a: Lock-in amplifier
13: Light-shielded state setting unit
14: Solar battery module operation voltage detection unit
15: Calibration line generation unit
16: Resistor relative ratio calculation unit
17: Solar battery cell operation voltage calculation unit
18: Alternating current clamp sensor
M: Solar battery module
C1, C2, C3, C4, C5: Solar battery cell
RL: Load resistor
L1: First calibration line
L2: Second calibration line
P1: First point
P2: Second point
P3: Third point
P4: Fourth point

What is claimed is:

1. A method for estimating an operation voltage of each of m (m is an integer which is equal to or greater than 2) solar battery cells which constitute a solar battery module and are connected in series, the method comprising:
a first step of setting a state in which a first solar battery cell, which is one solar battery cell among the m solar battery cells, is shielded from light;
a second step of irradiating the first solar battery cell with modulated light and detecting a small change of an output current of the solar battery module in the state in which the first solar battery cell is shielded from light;
a third step of irradiating each of the (m−1) solar battery cells excluding the first solar battery cell among the m solar battery cells with the modulated light and detecting the small change of the output current of the solar battery module in the state in which the first solar battery cell is shielded from light;
a fourth step of detecting an operation voltage of the solar battery module in the state in which the first solar battery cell is shielded from light;
a fifth step of generating a first calibration line by connecting a first point and a second point which are plotted on coordinate axes in which a first axis corresponding to one axis is set as a voltage and a second axis corresponding to the other axis is set as a relative ratio of a resistor;
a sixth step of setting a state in which none of the m solar battery cells is shielded from light;
a seventh step of irradiating a second solar battery cell which is a solar battery cell the operation voltage of which is to be estimated among the m solar battery cells with the modulated light and detecting the small change of the output current of the solar battery module in the state in which none of the m solar battery cells is shielded from light;
an eighth step of irradiating a third solar battery cell, which is a solar battery cell other than the second solar battery cell among the m solar battery cells, with the modulated light and detecting the small change of the output current of the solar battery module in the state in which none of the m solar battery cells is shielded from light;
a ninth step of detecting an operation voltage of the solar battery module in the state in which none of the m solar battery cells is shielded from light;
a tenth step of generating a second calibration line by connecting a third point and the second point which are plotted on the coordinate axes;
an eleventh step of calculating a value of the relative ratio of the resistor of the second solar battery cell;
a twelfth step of calculating a fourth point, which is a point on the second calibration line at which a value of the second axis becomes a value of the relative ratio of the resistor of the second solar battery cell calculated in the tenth step; and
a thirteenth step of calculating a value of the first axis of the fourth point as the operation voltage of the second solar battery cell, wherein
the first point shows a relationship between the value of the operation voltage of the first solar battery cell and the value of the relative ratio of the resistor in the state in which the first solar battery cell is shielded from light,
a value of the first axis of the first point is obtained by subtracting a total value of an open circuit voltage of each of the (m−1) solar battery cells from the operation voltage of the solar battery module in the state in which the first solar battery cell is shielded from light,
a value of the second axis of the first point is a maximum value of the relative ratio of the resistor,
the second point shows a relationship between a value of the operation voltage of any of the (m−1) solar battery cells and the value of the relative ratio of the resistor in the state in which the first solar battery cell is shielded from light,
a value of the first axis of the second point is the open circuit voltage of each of the (m−1) solar battery cells,
a value of the second axis of the second point is a minimum value of the relative ratio of the resistor,
a value of the first axis of the third point is obtained by subtracting a total value of the open circuit voltage of each of the (m−1) solar battery cells from the operation voltage of the solar battery module in the state in which none of the m solar battery cells is shielded from light, and a value of the second axis of the third point is the maximum value of the relative ratio of the resistor.

2. The method for estimating an operation voltage of a solar battery cell in a solar battery module according to claim 1, wherein the relative ratio of the resistor is obtained by dividing a value of a differential resistance of any of the (m−1) solar battery cells by a sum of a total value of all differential resistances of the m solar battery cells and a value of a load resistor connected in series to the solar battery module.

3. The method for estimating an operation voltage of a solar battery cell in a solar battery module according to claim 1, wherein the small change of the output current of the solar battery module in the state in which the first solar battery cell is shielded from light and the small change of the output current of the solar battery module in the state in which none of the m solar battery cells is shielded from light are detected by an output voltage of a phase detection unit or a lock-in amplifier, and the eleventh step includes calculating a value of a ratio of the output voltage of the phase detection unit or the lock-in amplifier as the value of the relative ratio of the resistor of the second solar battery cell.

4. The method for estimating an operation voltage of a solar battery cell in a solar battery module according to claim 1, wherein the eleventh step includes calculating a standardized value as the value of the relative ratio of the resistor of the second solar battery cell, and the standardized value is obtained by dividing a value of a differential resistance of any of the (m−1) solar battery cells by a maximum value of a differential resistance of the first solar battery cell in the light-shielded state.

5. The method for estimating an operation voltage of a solar battery cell in a solar battery module according to claim 1, wherein the eleventh step includes calculating a standardized value as the value of the relative ratio of the resistor of the second solar battery cell, and the standardized value is obtained by dividing a value of a differential resistance of any of the (m−1) solar battery cells by a sum of a maximum value of a differential resistance of the first solar battery cell in the light-shielded state and the value of the differential resistance of any of the (m−1) solar battery cells.

6. The method for estimating an operation voltage of a solar battery cell in a solar battery module according to claim 1, wherein the state in which the first solar battery cell is shielded from light is obtained by attaching a mask to the first solar battery cell.

7. The method for estimating an operation voltage of a solar battery cell in a solar battery module according to claim 1, wherein the state in which the first solar battery cell is shielded from light is obtained by attaching a net to the first solar battery cell.

8. The method for estimating an operation voltage of a solar battery cell in a solar battery module according to claim 1, wherein the state in which the first solar battery cell is shielded from light is obtained by disposing a light-shielding object.

9. The method for estimating an operation voltage of a solar battery cell in a solar battery module according to claim 1, wherein an irradiation state of the modulated light is adjusted so that values of a light generation current in equivalent circuits of the (m−1) solar battery cells are equal to each other.

10. A solar battery cell operation voltage estimation system which estimates an operation voltage of each of m (m is an integer which is equal to or greater than 2) Solar battery cells which constitute a solar battery module and are connected in series, the system comprising:

a modulated light irradiation unit configured to irradiate any of the m solar battery cells with modulated light;

a light-shielded state setting unit configured to set a state in which a first solar battery cell, which is one solar battery cell of the m solar battery cells, is shielded from light;

an output current small change detection unit configured to irradiate the first solar battery cell with the modulated light and detect a small change of an output current of the solar battery module in the state in which the first solar battery cell is shielded from light, wherein the modulated light irradiation unit irradiates each of the (m−1) solar battery cells excluding the first solar battery cell among the m solar battery cells with the modulated light and the output current small change detection unit detects the small change of the output current of the solar battery module in the state in which the first solar battery cell is shielded from light by the light-shielded state setting unit, the system comprises:

a solar battery module operation voltage detection unit configured to detect an operation voltage of the solar battery module in the state in which the first solar battery cell is shielded from light; and a calibration line generation unit configured to generate a first calibration line by connecting a first point and a second point which are plotted on coordinate axes in which a first axis corresponding to one axis is set as a voltage, and a second axis corresponding to the other axis is set as a relative ratio of a resistor, the light-shielded state setting unit sets a state in which none of the m solar battery cells is shielded from light, the modulated light irradiation unit irradiates a second solar battery cell which is a solar battery cell the operation voltage of which is to be estimated among the m solar battery cells with modulated light, the output current small change detection unit detects the small change of the output current of the solar battery module, the modulated light irradiation unit irradiates a third solar battery cell, which is a solar battery cell other than the second solar battery cell among the m solar battery cells, with the modulated light, the output current small change detection unit detects the small change of the output current of the solar battery module, and the solar battery module operation voltage detection unit detects an operation voltage of the solar battery module in the state in which none of the m solar battery cells is shielded from light, the calibration line generation unit generates a second calibration line by connecting a third point and the second point which are plotted on the coordinate axes, the system comprises:
a resistor relative ratio calculation unit configured to calculate a value of the relative ratio of the resistor of the second solar battery cell; and
a solar battery cell operation voltage calculation unit configured to calculate the operation voltage of the second solar battery cell, wherein
the solar battery cell operation voltage calculation unit calculates a fourth point, which is a point on the second calibration line at which a value of the second axis becomes a value of the relative ratio of the resistor of the second solar battery cell calculated by the resistor relative ratio calculation unit, and subsequently calculates a value of the first axis of the fourth point as the operation voltage of the second solar battery cell,
the first point shows a relationship between the value of the operation voltage of the first solar battery cell and the value of the relative ratio of the resistor in the state in which the first solar battery cell is shielded from light,
a value of the first axis of the first point is obtained by subtracting a total value of an open circuit voltage of each of the (m−1) solar battery cells from the operation voltage of the solar battery module in the state in which the first solar battery cell is shielded from light,
a value of the second axis of the first point is a maximum value of the relative ratio of the resistor,
the second point shows a relationship between a value of the operation voltage of any of the (m−1) solar battery cells and the value of the relative ratio of the resistor in the state in which the first solar battery cell is shielded from light,
a value of the first axis of the second point is the open circuit voltage of each of the (m−1) solar battery cells,
a value of the second axis of the second point is a minimum value of the relative ratio of the resistor,
a value of the first axis of the third point is obtained by subtracting a total value of the open circuit voltage of each of the (m−1) solar battery cells from the operation voltage of the solar battery module in the state in which none of the m solar battery cells is shielded from light, and
a value of the second axis of the third point is the maximum value of the relative ratio of the resistor.

* * * * *